(12) United States Patent
    Castaldo

(10) Patent No.: US 9,350,149 B2
(45) Date of Patent: May 24, 2016

(54) UNIVERSAL BOX SYSTEM

(71) Applicant: Leviton Manufacturing Co., Inc., Melville, NY (US)

(72) Inventor: Cosmo Castaldo, Westbury, NY (US)

(73) Assignee: Leviton Manufacturing Co., Inc., Melville, NY (US)

( * ) Notice: Subject to any disclaimer, the term of this patent is extended or adjusted under 35 U.S.C. 154(b) by 0 days.

(21) Appl. No.: 14/474,592

(22) Filed: Sep. 2, 2014

(65) Prior Publication Data
    US 2014/0367162 A1    Dec. 18, 2014

Related U.S. Application Data

(63) Continuation of application No. 13/917,938, filed on Jun. 14, 2013, now Pat. No. 8,847,071, which is a continuation of application No. 12/787,336, filed on May 25, 2010, now Pat. No. 8,497,424.

(51) Int. Cl.
    | | |
    |---|---|
    | *H02G 3/18* | (2006.01) |
    | *H02G 3/08* | (2006.01) |
    | *H05K 5/02* | (2006.01) |
    | *H04L 25/49* | (2006.01) |
    | *H02G 1/14* | (2006.01) |
    | *H02G 3/14* | (2006.01) |
    | *H01H 19/06* | (2006.01) |

(52) U.S. Cl.
    CPC .............. *H02G 3/081* (2013.01); *H02G 1/14* (2013.01); *H02G 3/088* (2013.01); *H02G 3/14* (2013.01); *H02G 3/18* (2013.01); *H04L 25/4902* (2013.01); *H05K 5/0217* (2013.01); *H01H 19/06* (2013.01); *Y10T 29/49002* (2015.01)

(58) Field of Classification Search
    USPC .............................................. 174/50, 58, 564
    See application file for complete search history.

(56) References Cited

U.S. PATENT DOCUMENTS

| 4,484,021 A * | 11/1984 | Schaefer | H02G 3/18 174/53 |
    |---|---|---|---|
    | 4,998,635 A * | 3/1991 | Vink et al. | 220/3.4 |
    | 5,779,083 A * | 7/1998 | Bordwell | 220/242 |
    | 6,681,948 B1 * | 1/2004 | Santa Cruz | H02G 3/12 174/66 |
    | 6,837,008 B2 * | 1/2005 | Roberts et al. | 52/101 |
    | 7,939,756 B2 * | 5/2011 | Daniels | H02G 3/14 174/66 |

* cited by examiner

*Primary Examiner* — Dhirubhai R Patel
    (74) *Attorney, Agent, or Firm* — Leviton Manufacturing Co., Inc.

(57) ABSTRACT

A universal electrical box which includes a body having at least one opening for receiving an electrical device. The device can also include at least one mounting bracket coupled to the body, and at least one frame configured to be coupled to the at least one body. In addition there is at least one duplex electrical mounting plate configured to couple to the at least one frame. In this case, the duplex electrical mounting plate is configured to revive a duplex electrical device. In addition, there is at least one sealing gasket configured to be coupled to the body between the at least one frame and the body. This design allows for a universal configuration which allows for multiple different types of electrical devices to be coupled to the enclosure.

21 Claims, 19 Drawing Sheets

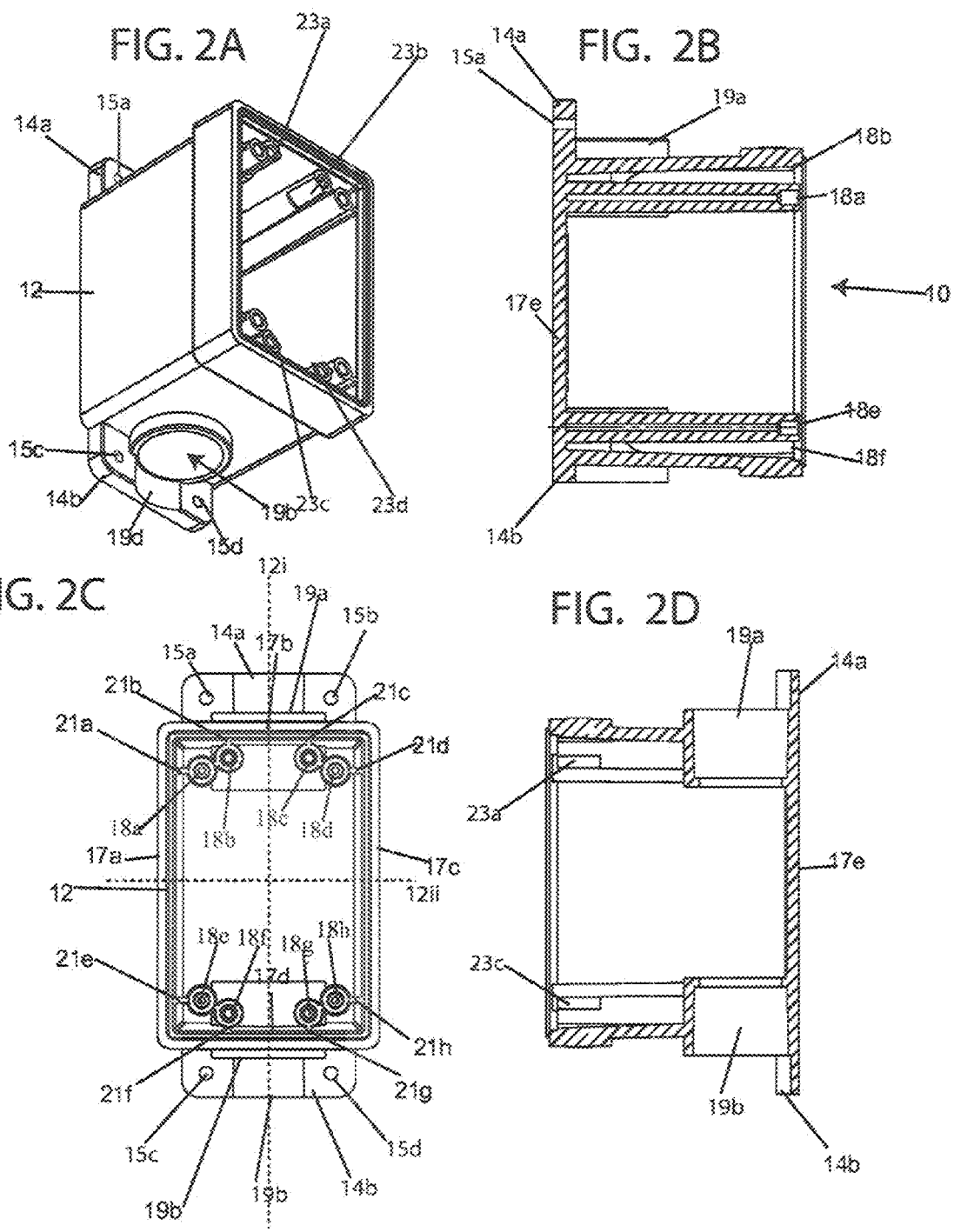

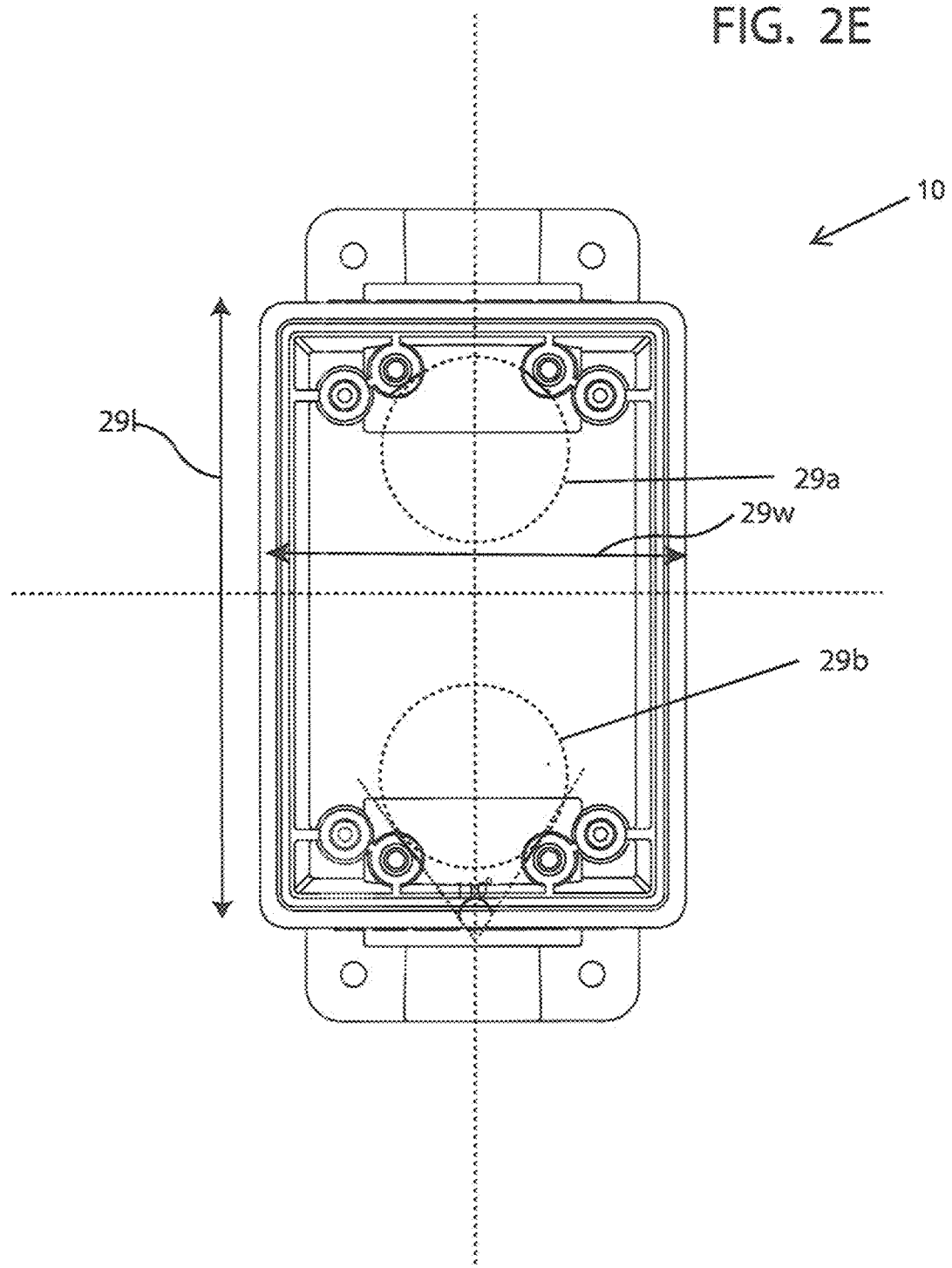

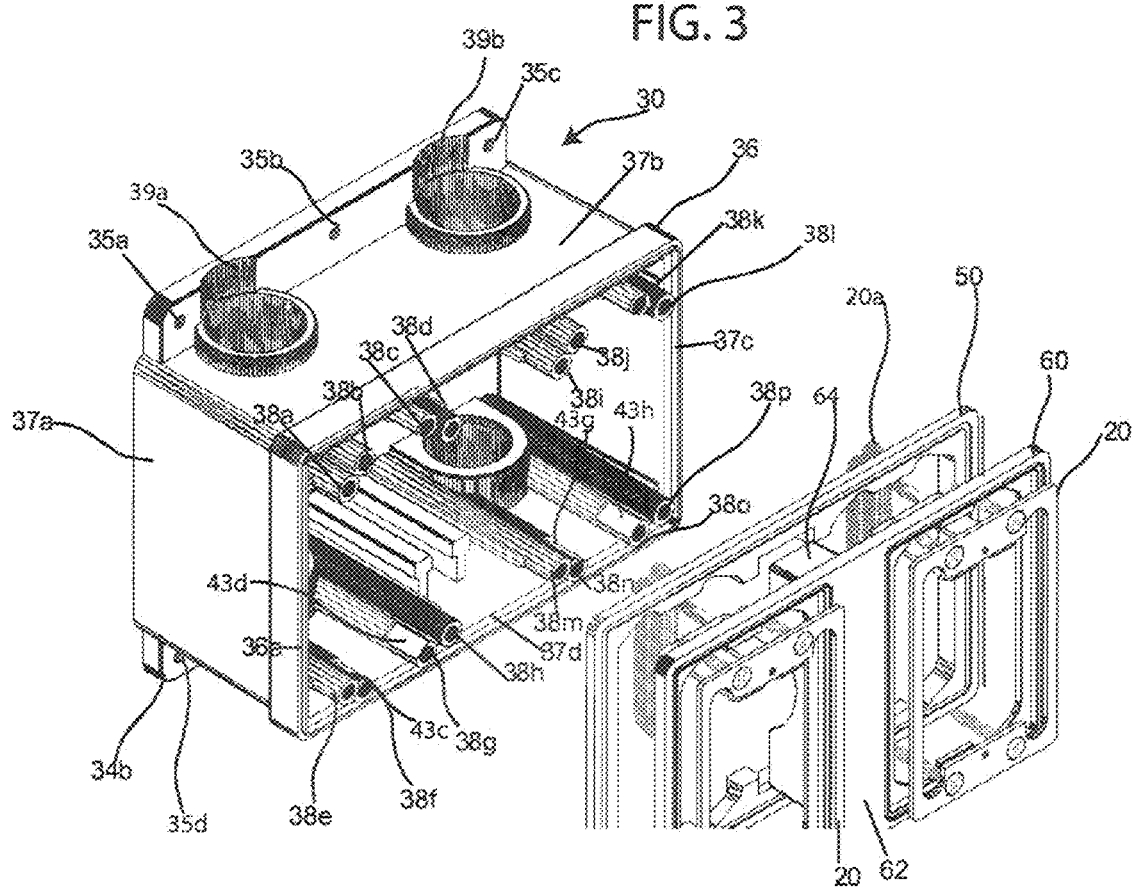

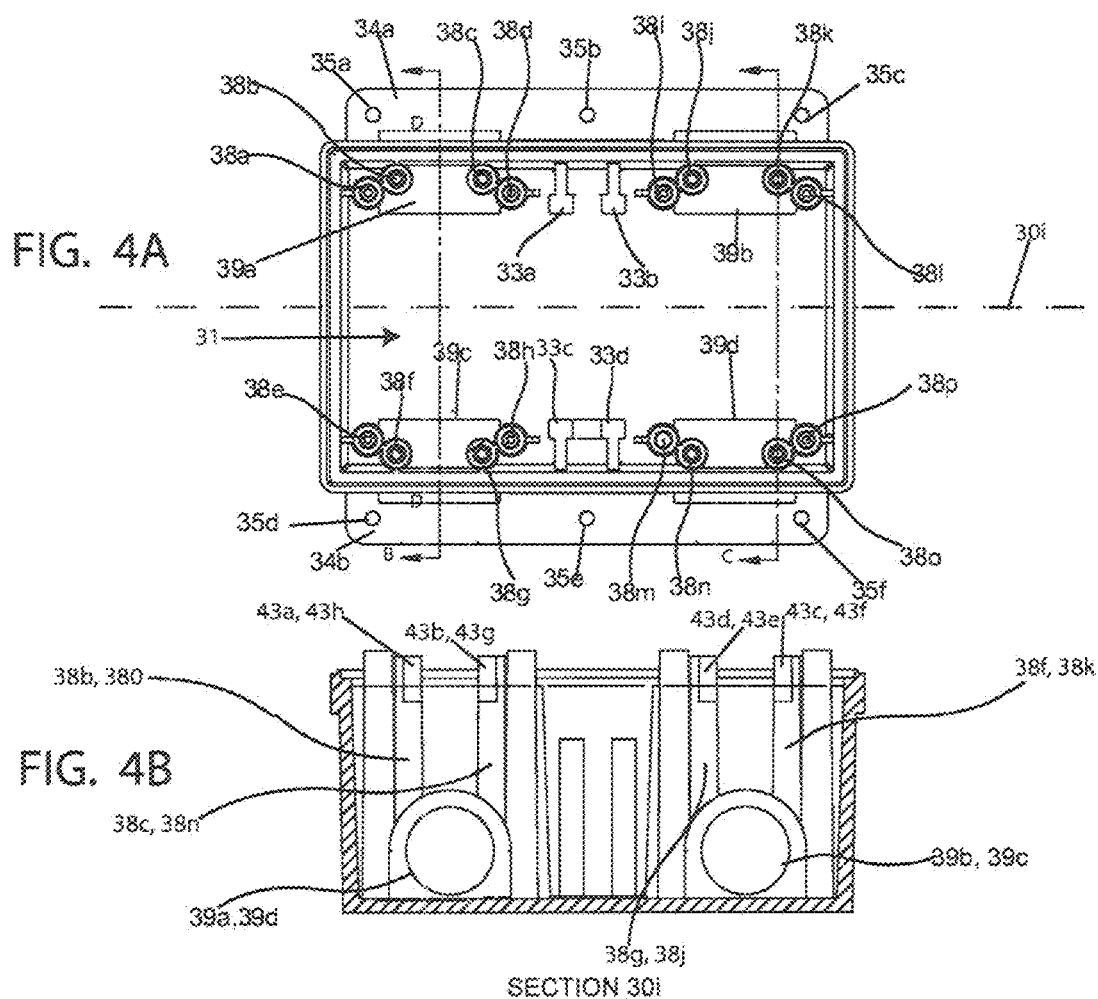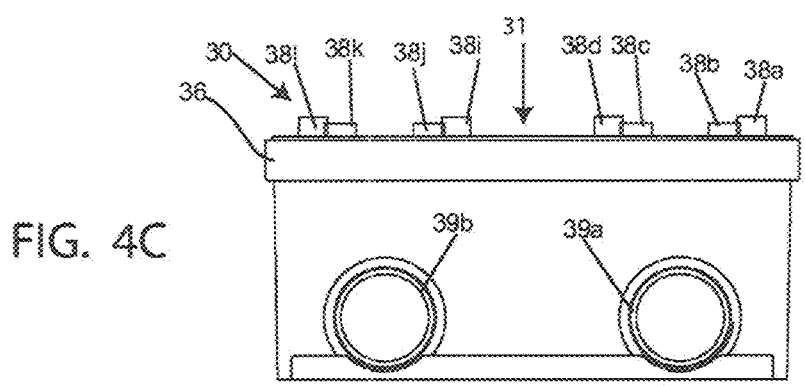

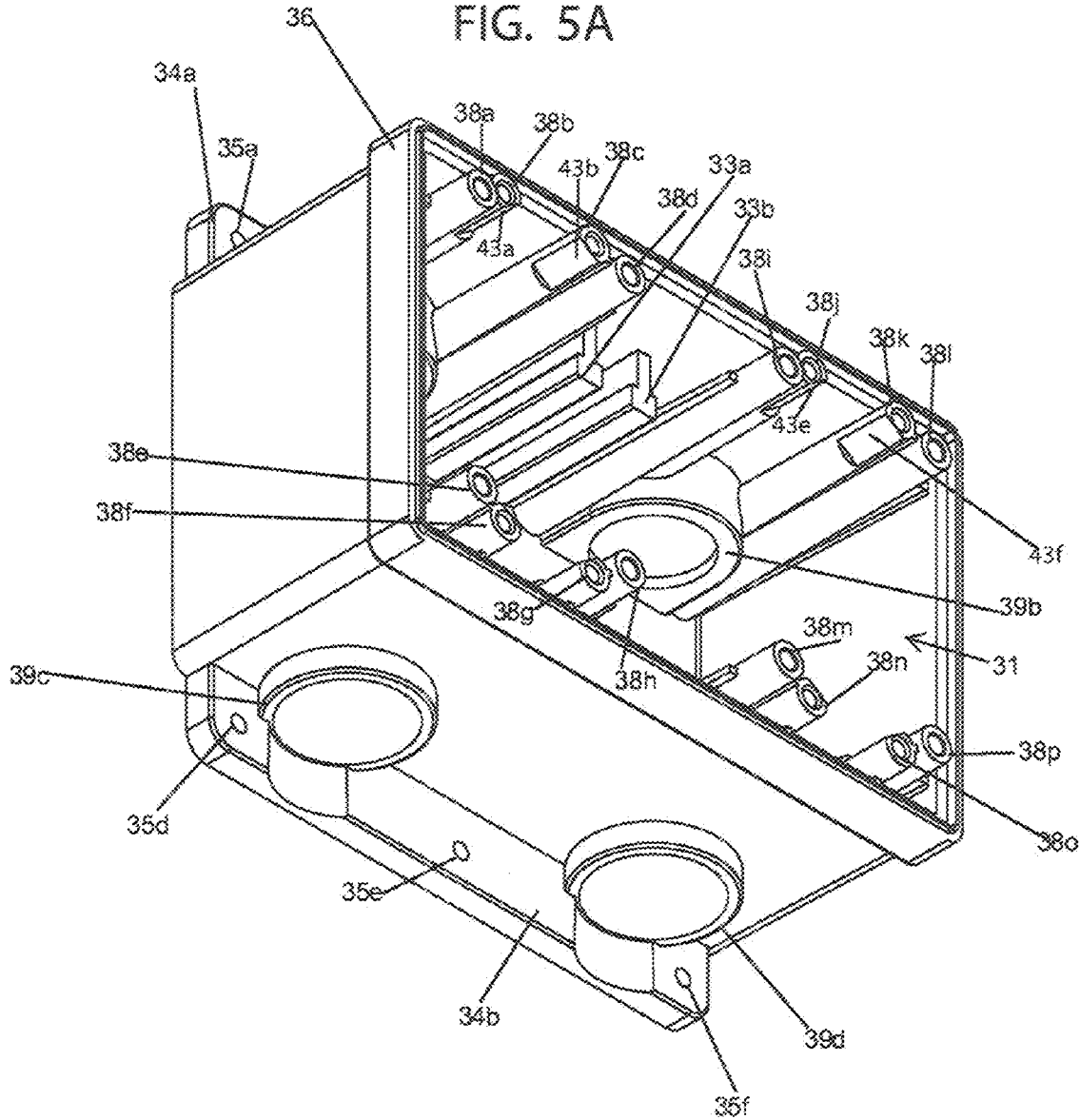

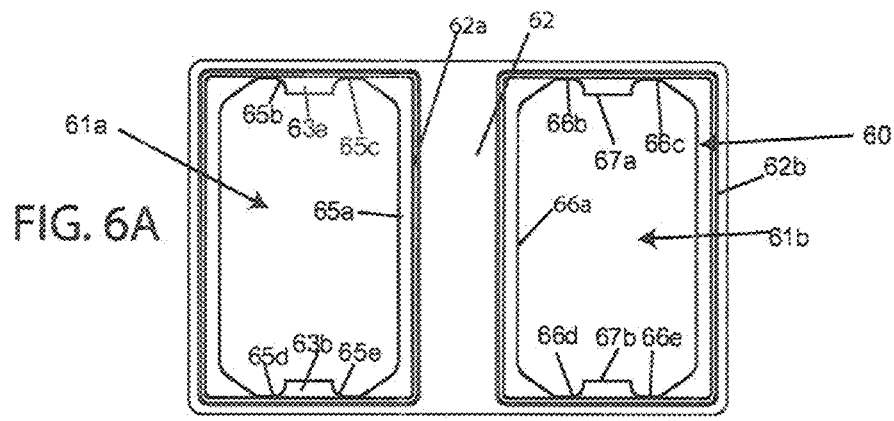
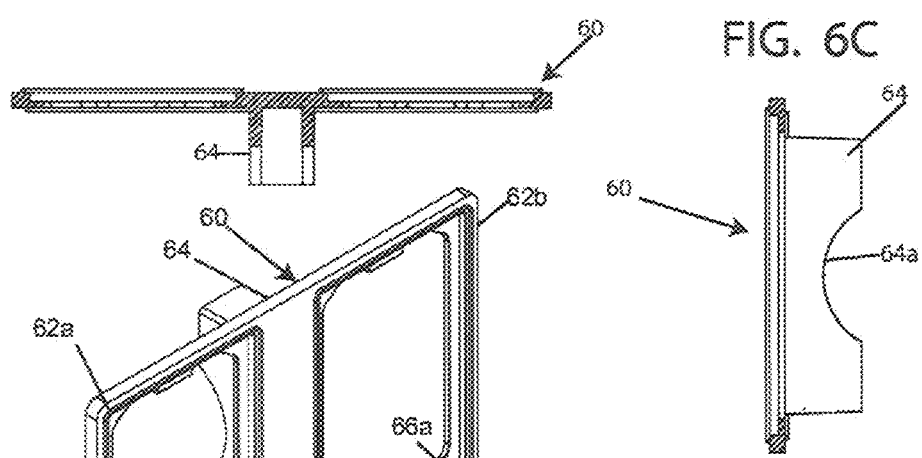
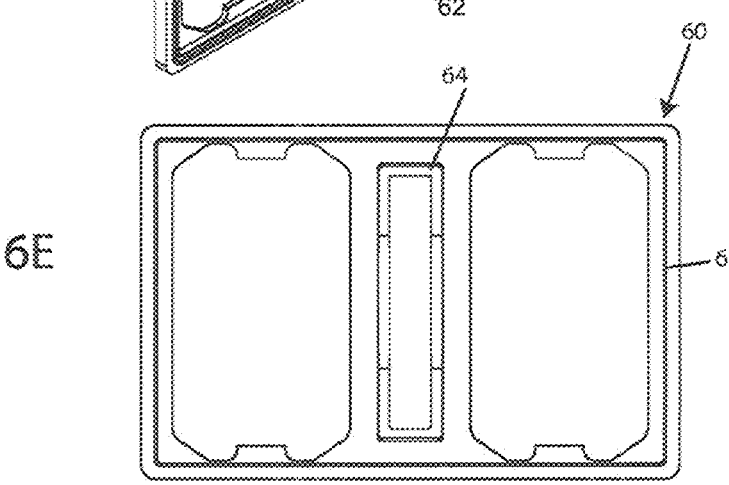

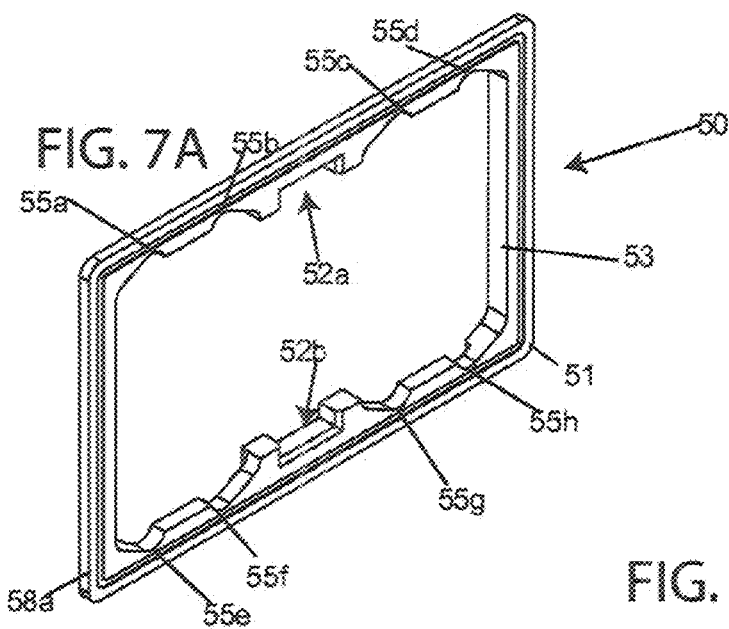
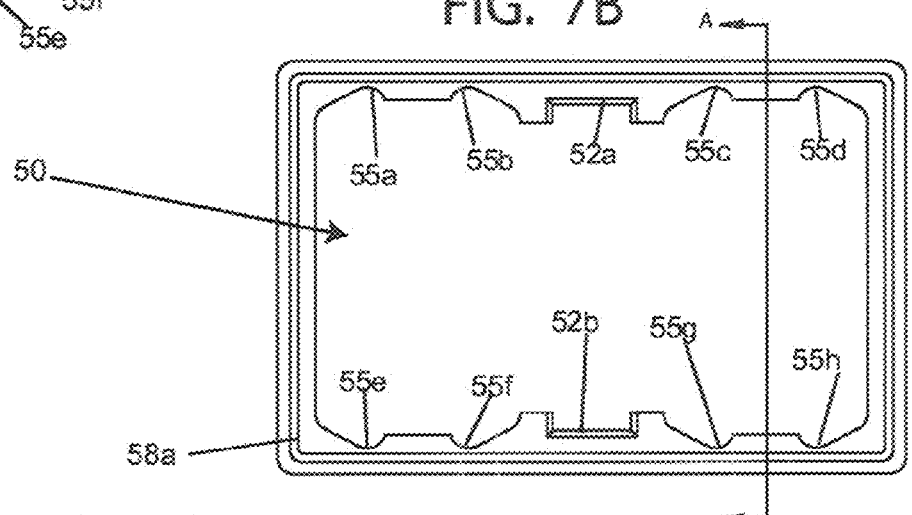
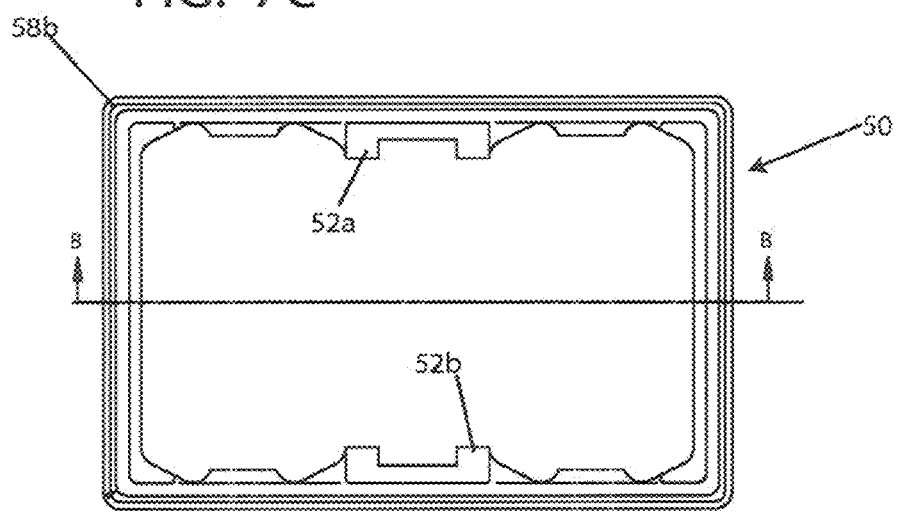

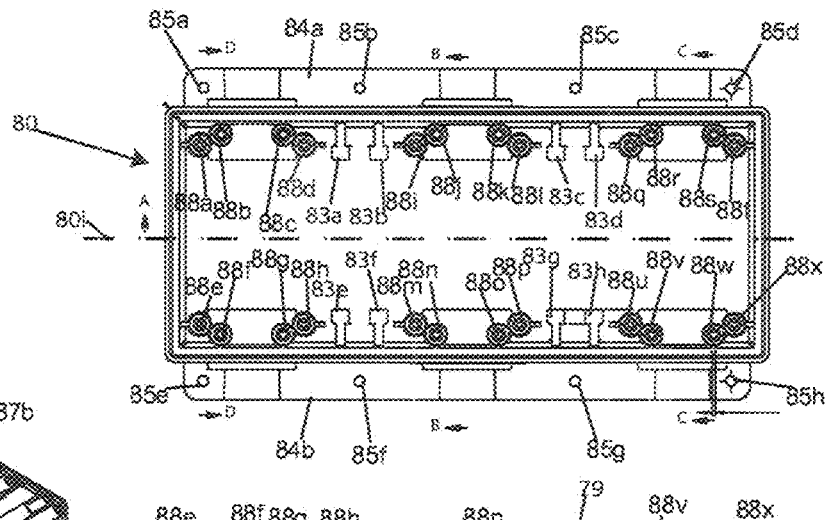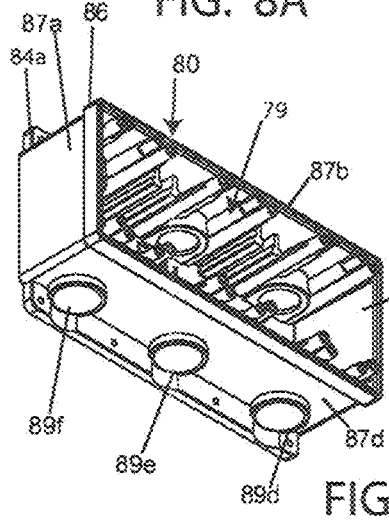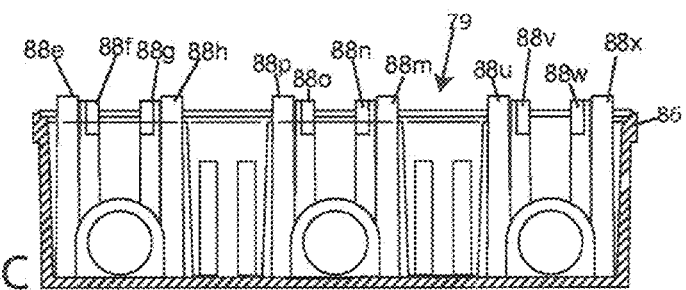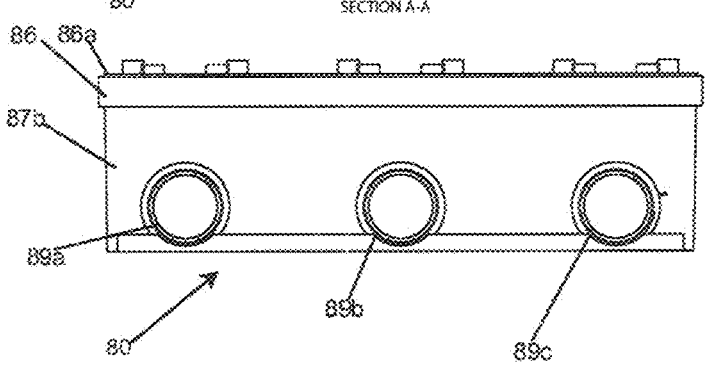

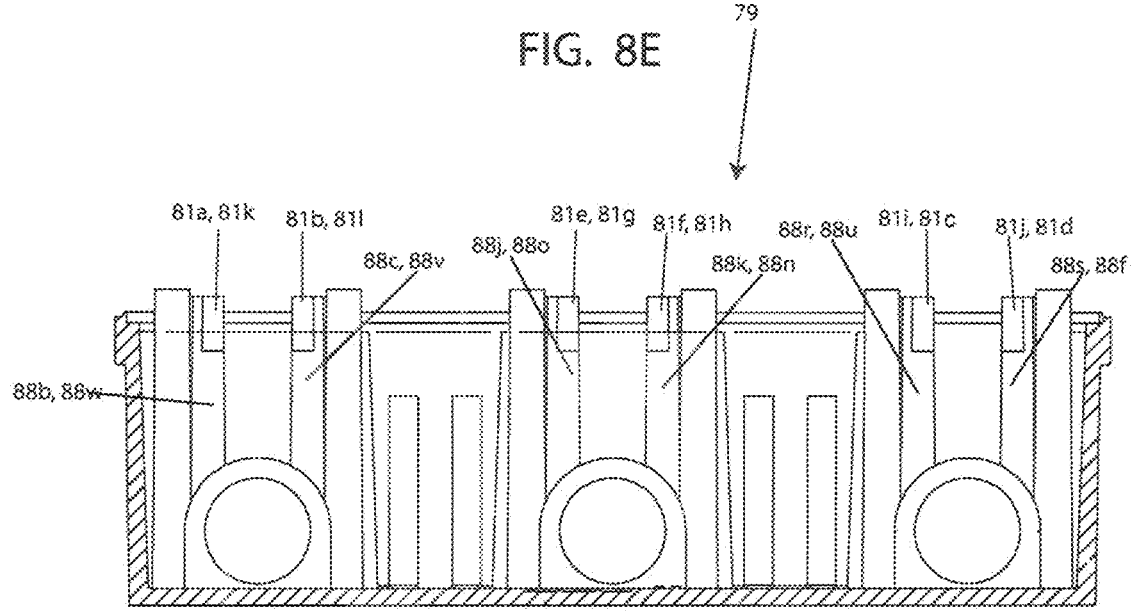
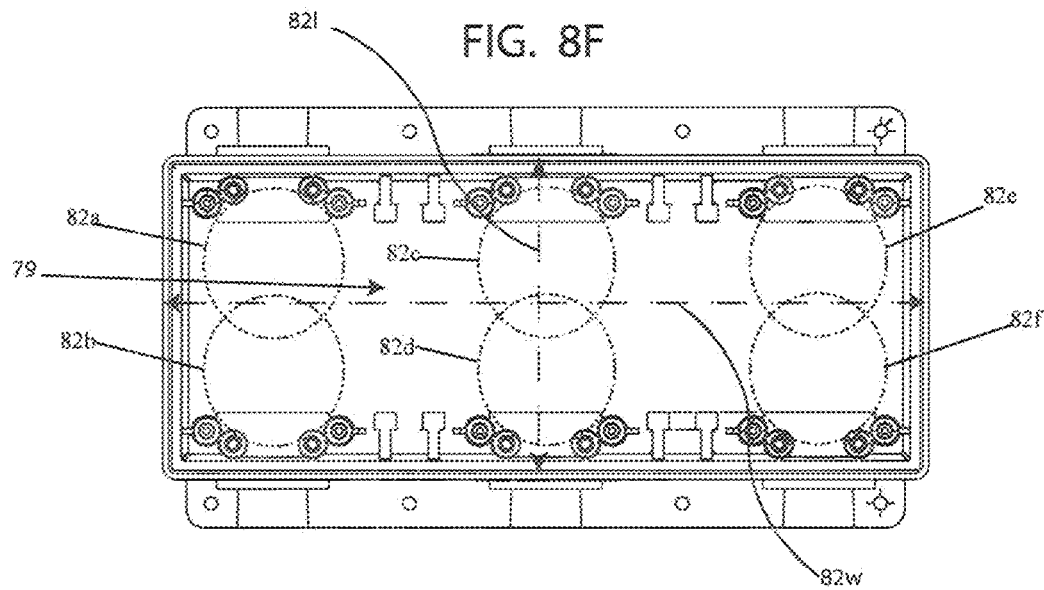

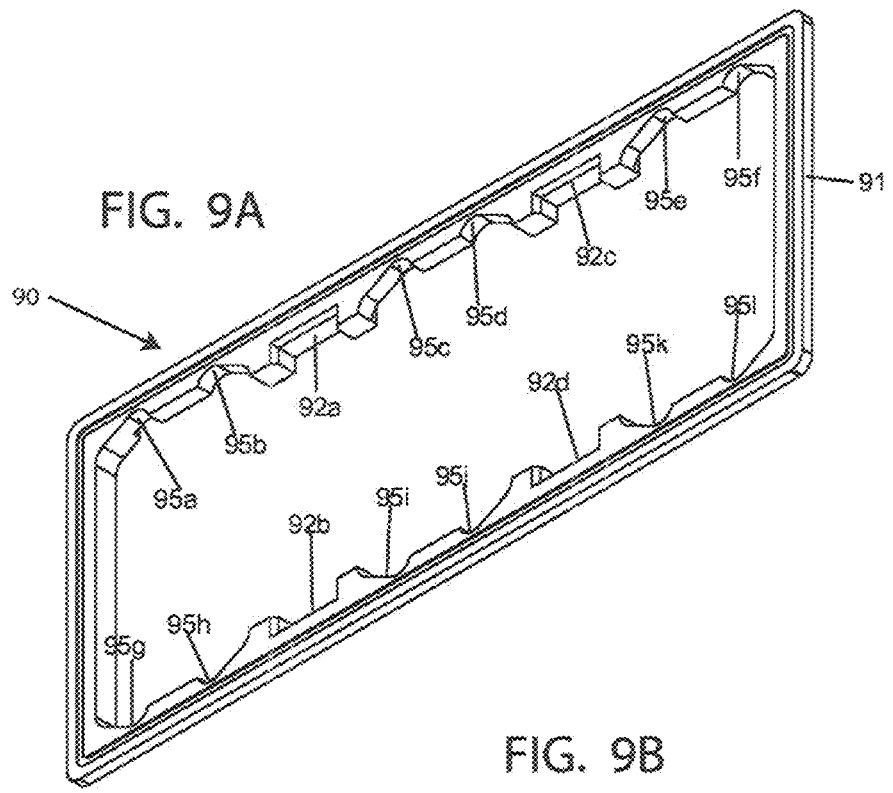
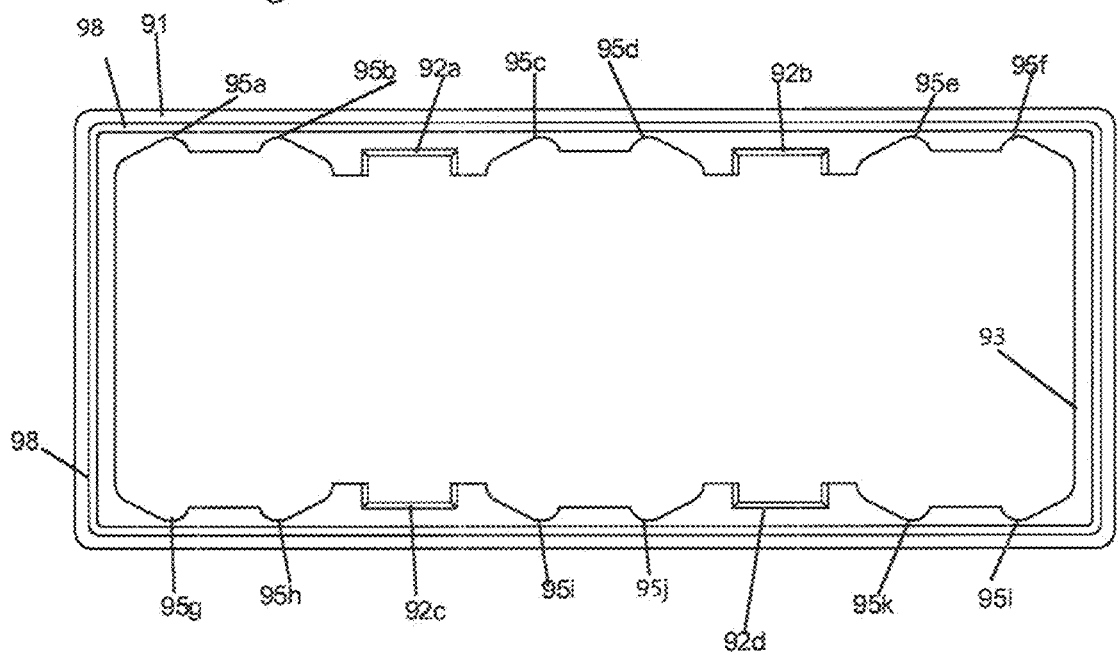

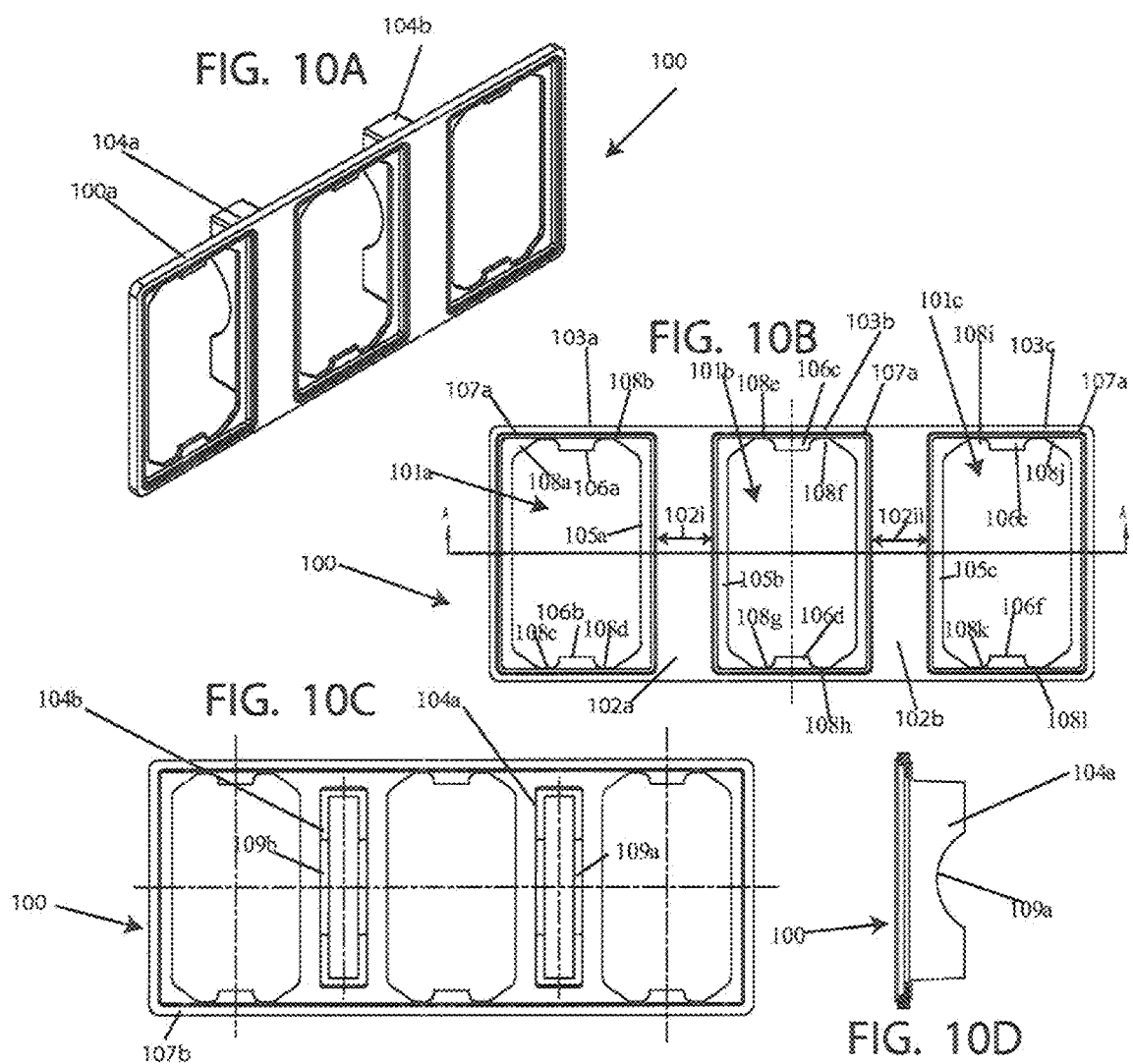

UNIVERSAL BOX SYSTEM

CROSS REFERENCE TO RELATED APPLICATIONS

This application is a continuation application of U.S. patent application Ser. No. 13/917,938, now U.S. Pat. No. 8,847,071, filed on Jun. 14, 2013, which is a continuation of U.S. patent application Ser. No. 12/787,336 filed on May 25, 2010, now U.S. Pat. No. 8,497,424, the disclosures of which are hereby incorporated by reference.

BACKGROUND

One embodiment of the invention relates to a universal box system which is configured to work with any type box, in particular FD boxes, which allows for the mounting of multiple different types of electrical devices to the FD box. The universal box system can include multiple different adapters which are configured to be connected to the universal box to allow different types of electrical devices to be connected to the universal box.

There are currently multiple types of electrical devices that can be coupled to a FD box, including strap mounted electrical devices, non strap mounted electrical devices, or water resistant devices. Currently there is no known box that is universally adaptable to receive strap based electrical devices, non strap based electrical devices or water resistant electrical devices.

In addition, with regard to FD boxes, particularly in the multiple gang type devices, previously, electrical devices would be ganged together with a double gang cover, triple gang cover or other type of multi ganged cover, which would have to be pre-fabricated to fit on a multi ganged box. This is because prior to the present invention, there was no known box and system which would allow for the individual mounting of single gang devices and covers across a multi ganged enclosure. Therefore, there is a need for a universal mounting face as described above, and/or a system which allows fox the mounting of multiple single gang devices and individual single gang covers on a multi gang box.

SUMMARY

At least one embodiment of the invention relates to a universal electrical box such as a FD box, comprising a body having at least one opening for receiving an electrical device. In addition, there is at least one opening for receiving electrical wiring from building wiring. The device can also include at least one mounting bracket coupled to the body, and at least one plate configured to be coupled to the at least one body. In addition, there is at least one duplex electrical frame configured to couple to the at least one plate. The duplex electrical frame is configured to receive a duplex electrical device. In addition, there is at least one sealing gasket configured to be coupled to the body between the at least one frame and the body. This design allows for a universal configuration which allows for multiple different types of electrical devices to be coupled to the enclosure.

At least one additional embodiment relates to a system which is configured to allow multiple different single gang devices and associated front covers to be mounted on a multi ganged enclosure or box. One embodiment includes a multi ganged box which is dimensioned such that there are multiple different connection interfaces for receiving multiple different single gang electrical devices. In addition, this multi ganged system includes at least one frame which has sufficient spacing to both cover open sections of the box while still providing sufficient spacing between each connection interface to allow multiple different single gang electrical devices and enclosures to be coupled thereto without interfering with each other.

BRIEF DESCRIPTION OF THE DRAWINGS

Other objects and features of the present invention will become apparent from the following detailed description considered in connection with the accompanying drawings. It should be understood, however, that the drawings are designed for the purpose of illustration only and not as a definition of the limits of the invention.

In the drawings, wherein similar reference characters denote similar elements throughout the several views:

FIG. 2A is a perspective view of the unassembled first embodiment of a box;

FIG. 2B is a side cross-sectional view of the universal box shown in FIG. 2A;

FIG. 2C is a front view of the universal box shown in FIGS. 1A, 1B, 2A and 2B;

FIG. 2D is a side cross sectional view taken down the middle of the universal box of FIG. 2A;

FIG. 2E shows a front view showing the connection regions for connecting a duplex electrical device;

FIG. 3 is an exploded perspective view of a second embodiment;

FIG. 4A is a front view of the second embodiment;

FIG. 4B is a side cross-sectional view of the embodiment shown in FIG. 4A;

FIG. 4C is a top view of a universal box of FIG. 3;

FIG. 5A is a perspective view of the universal box of FIG. 3;

FIG. 6A is a front view of a frame for use with the universal box of FIG. 3;

FIG. 6B is a side cross-sectional view of the frame;

FIG. 6C is a side view of the frame;

FIG. 6D is a perspective view of the frame;

FIG. 6E is a back view of the frame;

FIG. 7A is a front perspective view of the gasket shown in FIG. 3;

FIG. 7B is a front view of the gasket;

FIG. 7C is a back view of the gasket;

FIG. 8A is a perspective view of a triple gang universal box;

FIG. 8B is a front view of the universal box shown in FIG. 8A;

FIG. 8C is a top cross-sectional view of the universal box shown in FIG. 8B;

FIG. 8D is a top view of the universal box shown in FIGS. 8A, 8B;

FIG. 8E shows a top or bottom cross-sectional view of the triple gang box shown in FIG. 8A;

FIG. 8F shows a front view of a triple gang box showing connection regions;

FIG. 9A is a perspective view of a triple gang gasket; and

FIG. 9B is a front view of a triple gang gasket.

FIG. 10A is a perspective view of a frame for use with a triple gang box;

FIG. 10B is a front view of the frame shown in FIG. 10A;

FIG. 10C is a back view of the frame shown in FIG. 10A;

FIG. 10D is a side view of the frame shown in FIG. 10A;

DETAILED DESCRIPTION

Figure 1A:
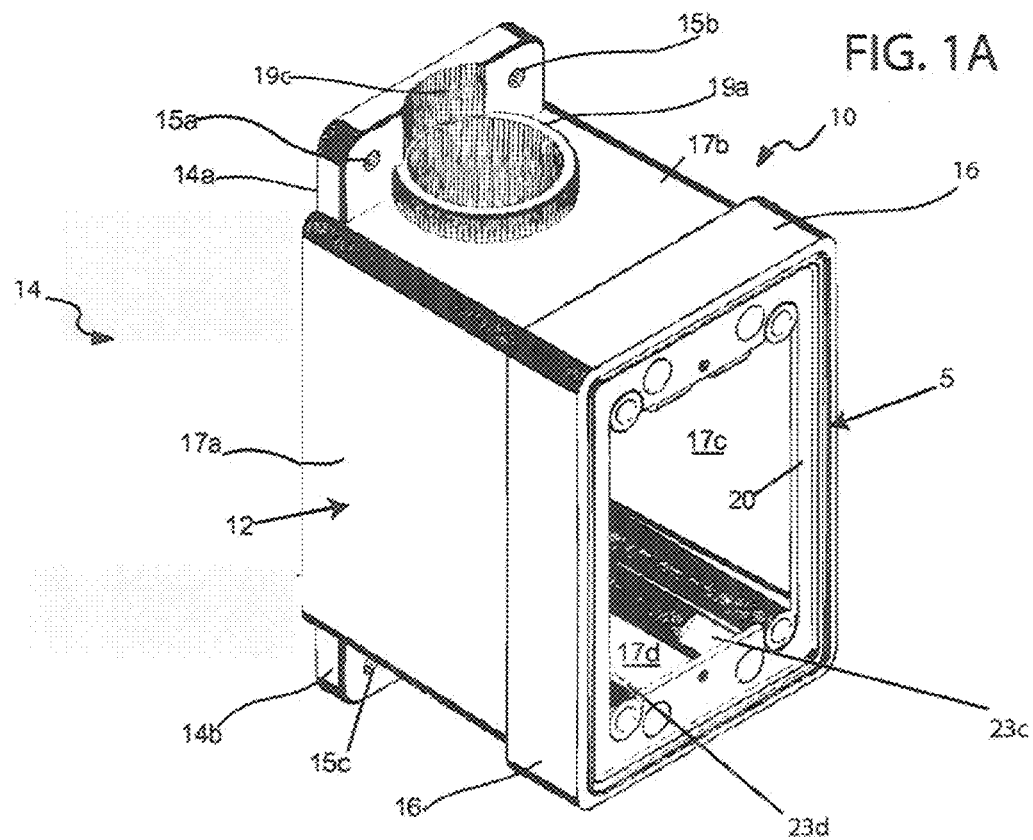
FIG. 1A is a perspective view of a first embodiment of a single gang box fully assembled.
Figure 1B:
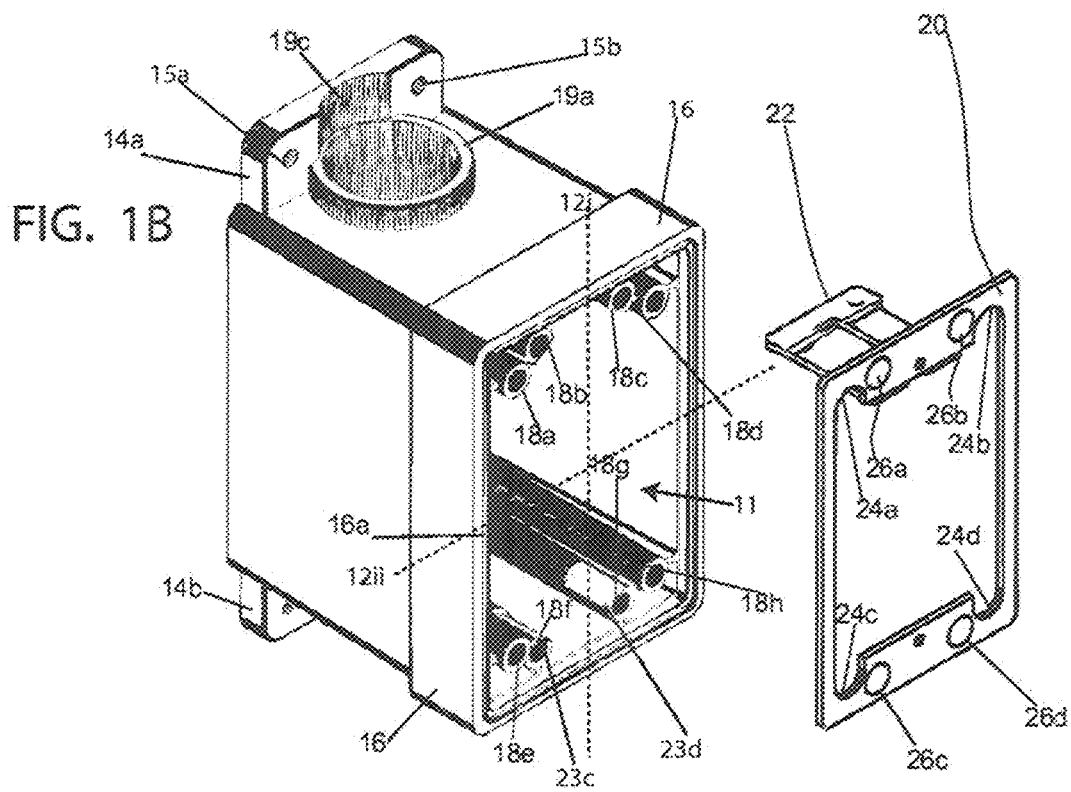
FIG. 1B is a perspective exploded view of the first embodiment.

Referring in detail to the drawings, FIG. 1A-B is a front perspective view of a first embodiment 5, which includes a universal electrical box 10, which can be in the form of a FD box, wherein this box comprises a body 12, and a back mounting bracket 14. Box 10 can be made from any known suitable material such as metal, ceramic, composite, polymer, or plastic. In at least one embodiment, the box 10 is made from PVC or polyvinyl chloride. Body 12 is substantially rectangular, and in this embodiment, is a single gang enclosure having five sides and an open front. This box 10 is in the form of a universal box which is configured to be coupled to an outdoor portion of a building such as an office building or a house.

Body 12 has a mounting or connection interface 11 formed in a front opening. Body 12 is configured to receive multiple different types of single-gang sized electrical devices such as receptacles, light switches, indicator lights or any other type of suitable single gang device in this mounting or connection interface 11. For purposes of this application, the term single gang refers to a dimension sufficient to receive a single electrical device such as a standard duplex electrical receptacle. The dimensions of the terms "single gang", "double gang", and "triple gang" are generally known in the industry and indicated by NEMA. Therefore, for purposes of this application a double gang dimension is a dimension sufficient to receive at least two electrical devices such as two duplex electrical receptacles in a side by side manner. The term triple gang refers to a dimension sufficient to receive at least three electrical devices such as three duplex electrical receptacles in a side by side manner.

Back mounting bracket 14 comprises a first end 14a, and a second end 14b. These ends each including holes wherein the first end 14a includes holes 15a and 15b while the second end 14b comprises holes 15c and 15d (See FIG. 2A).

Body 12 also includes a front rim 16 which expands from the body 12 to accommodate additional adapters such as a front plate, or any other type of appropriate adapter. Front rim 16 also includes an additional guide rim 16a (See FIG. 1B) which extends out from a front face of front rim 16.

In addition, body 12 includes five walls, including a first side wall 17a, and a second side wall 17b extending perpendicular or substantially perpendicular to the first side wall 17a. A third side wall 17c (See FIG. 2C) is perpendicular or substantially perpendicular to the second side wall 17b and extends substantially parallel to the first side wall 17a. A fourth side wall 17d is perpendicular or substantially perpendicular to the first side walls 17a and the third side wall 17c and extends substantially parallel to the second side wall 17b. In addition, a fifth back wall 17e (See FIG. 2B) extends substantially perpendicular to the side walls 17a-d. These walls 17a-17e are connected together to form an open-faced box, however, other style configurations can be used such as a square box, a rounded box, a circle, hexagon, octagon, pentagon, or any other round shaped device or polygonal shaped device.

FIG. 1B shows a front perspective exploded view of the embodiment shown in FIG. 1A wherein in this view, there is a front plate 20, having a tongue 22 which extends substantially perpendicular to the body of the front plate. This plate 20 includes a plurality of openings 24a, 24b, 24c, and 24d. The plate 20 can be made from any suitable material but in at least one embodiment, it is a metal plate made from a metal such as stainless steel. Body 12 includes a plurality of connection elements which can be comprised of any known connection elements but in this case comprise cylindrically shaped posts 18a, 18b, 18c and 18d, 18e, 18f, 18g, and 18h. Posts 18a and 18b are disposed in a first corner, posts 18c and 18d are disposed in a second corner, posts 18e and 18f are disposed in a third corner, and posts 18g and 18h are disposed in a fourth corner. The first axis 12i extends lengthwise across the box 10. Posts 18a and 18d are at substantially the same position lengthwise along a first dimension or length (l), posts 18b and 18c are at substantially the same position lengthwise along this first dimension, posts 18e and 18h are at substantially the same position lengthwise along the first dimension or length (12i) while posts 18f and 18g are at substantially the same position lengthwise along this dimension (l) along axis 12i. This dimension l is the first dimension, and with a single gang enclosure is the longer dimension or expansion of the box. It also corresponds to the dimension that is parallel to the extension of wiring holes 19a and 19b (See FIG. 2A).

The second axis 12ii extends widthwise across the box 10. In addition, posts 18a and 18e are at substantially the same position width wise along the width dimension along axis 12ii, posts 18b and 18f are at substantially the same position width wise along the dimension (w), while posts 18c and 18g are at substantially the same dimension width wise 12ii, while posts 18d and 18h are at substantially the same dimension width wise (w). This post configuration allows for multiple different types of electrical devices, as well as plates to be coupled to the universal box. For example, in this view of FIG. 1B, the plate 20 has a plurality of eye holes 26a, 26b, 26c, and 26d wherein these eye holes are configured to line up with or be substantially concentric with corresponding posts 18b, 18c, 18f, and 18g.

There are a set of connection elements such as inner posts, and connection elements such as outer posts, wherein the inner posts are posts 18b, 18c, 18f and 18g, while the outer posts are posts 18a, 18d, 18e, and 18h. Inner posts are configured to selectively receive a strap based electrical mounting device while the outer posts are configured to receive a non-strap based electrical device or a front cover such as that shown in FIGS. 11A-13C. The outer posts are configured in the box based upon an industry standard spacing.

In addition, there are rounded corner openings in the plate 20 including openings 24a, 24b, 24c, and 24d, which are configured to be substantially concentric with outer posts 18a, 18d, 18e, and 18h, respectively. This design allows for additional components such as front covers to be connected to the plate 20 while also being connected directly to the body 12 of the universal box 10. Tongue 22 serves as a guide which guides plate 20 inside box 10. Furthermore, the inner connection elements formed as posts 18b, 18c, 18f and 18g are formed as recessed posts which are formed recessed relative to the outer posts 18a, 18d, 18e and 18h thereby allowing plate 20 to be inserted therein and forming a single flush mounting face for all of the posts.

The first and second wiring holes 19a and 19b are configured to receive building wire, which provides electrical power to the universal box 10. The first wiring hole 19a is configured to be adjacent to back mounting bracket 14, including first end 14a and second end 14b. Therefore, there is a first cut out 19c in first end 14a of back mounting bracket 14, and a second cut out 19d in the second end 14b of back mounting bracket 14. This allows a pipe fitting to be fit inside of wiring holes 19a and 19b.

FIG. 2A is a perspective view of the universal box 10. In this view, a second wiring hole 19b is shown which is substantially concentric with first wiring hole 19a. First and second wiring holes 19a, 19b allow building wiring to pass into the box. This view shows recesses or cut outs 23a, 23b, 23c, and 23d formed in the connection elements such as posts 18b, 18c, 18f, and 18g, which provide additional connection space for a device to be inserted into that region. Cut outs or recesses 23a and 23c are also shown in FIG. 2D as well.

FIG. 2B is a side cross-sectional view of the universal box 10, wherein in this view, posts 18a, 18b, 18e and 18f are shown extending frusto-conically into box 10 to show posts that are tapered in size. These posts 18a, 18b, 18e, 13f are shown extending substantially parallel to each other inside of body 12.

FIG. 2C is a front view of the universal box 10 which shows posts 18a, 18b, 18c, 18d, 18e, 18f, 18g and 18h extending as described above. Each of these posts has a corresponding connector 21a, 21b, 21c, 21d, 21e, 21f, 21g, and 21h for respective coupling the post to an adjacent side wall.

As shown in this view, body 12 comprises a first pair of substantially parallel spaced side walls, including first side wall 17a, and third side wall 17c extending substantially parallel to a first axis 12i; and a second pair of substantially parallel spaced side walls, including second side wall 17b and fourth side wall 17d extending substantially parallel to a second axis 12ii. Body 12 further comprises a plurality of posts 18a-18h as described above, comprising a first set of posts comprising posts 18a, 18d, 18e and 18h coupled to the first pair of substantially parallel spaced first and third sidewalls 17a, 17c, and a second set of posts comprising posts 18b, 18c, 18f, and 18g toeing coupled to the first set of posts 18a, 18d, 13e, 18h respectively, and being spaced apart from the first set of substantially parallel spaced first and third side walls 17a, 17c. These different sets of posts provide for multiple different connection surfaces to allow for multiple different types of plates as well as different types of electrical devices and covers to be coupled to the universal box.

FIG. 2B is a side cross sectional view taken down the middle of box 10, wherein this view shows first and second wiring holes 19a and 19b extending concentrically into box 10. This view also shows recesses 23a and 23c formed in box 10.

FIG. 2E shows a front view of the single gang box 10, which shows a standard width dimension 29w and a standard length dimension 29l. In addition, because of recesses 23a-d (FIG. 2A), there are formed two separate connection, or mounting regions 29a and 29b which are configured to receive a duplex wiring device which can have in at least one instance a circular or rounded dimension. These recesses 23a-d allow for additional devices, such as duplex electrical receptacles, to be installed therein. As shown, these recesses 23a-d are formed as angled, flat shaped cut-outs formed in rounded posts. These recesses 23a-d allow for curved or rounded receptacle elements to slide therein.

FIG. 3 is an exploded perspective view of a second embodiment which shows a double gang universal box 30, which essentially comprises two sets of boxes 10 (See FIG. 2A) without intervening walls. Box 30 comprises an expansive front rim 36, and first side wall 37a, second side wall 37b, third side wall 37c, fourth side wall 37d and a fifth back wall 37e wherein these walls are coupled together to form an open box. Front rim 36 further comprises a front edge rim 36a which is configured to index with plates, covers, gaskets, and frames which can be coupled to this front rim. Front rim 36 extends around a front opening forming a connection interface 31 (FIG. 4A). Essentially the connection interface 31 is formed by the opening in the box and the surrounding connection elements.

The term index or indexing essentially relates to aligning components together in a complementary manner such that they fit in their desired manner. Grooves, protrusions, keys, male-female connections can be used to index two components together.

Double gang universal box 30 comprises a plurality of different connection elements such as posts 38a, 38b, 38c, 38d, 38e, 33f, 38g, 38h, 38i, 38j, 38k, 38l, 38m, 38n, 38o, 38p. A first group of posts 38a-38h correspond in dimension and spacing to posts 18a-18h, while a second group of posts 38i-38p correspond in dimension and spacing to posts 18a-18h as well. Therefore, these two groups of connection posts 38a-h, 38i-p form a connection interface having two different types of connections in a double gang enclosure.

Posts 38b, 38c, 38f, and 38g correspond to inner posts, along with posts 38j, 38k, 38n, and 38o also forming inner posts. Consequently, posts 38a, 38d, 38e, and 38h, along with posts 38i, 38l, 38m, and 38p form outer posts. Therefore, these posts provide a universal or nearly universally adaptable face for receiving fasteners for coupling to brackets, plates, gaskets, or for coupling directly with different electrical devices with the inner posts being configured to receive strap based electrical devices while the outer posts are configured to receive front covers shown in FIGS. 11A-13C. In addition, posts 38d and 38h are spaced apart from posts 38i and 38m such that a sufficient distance is created to allow two different individual single gang electrical devices to be mounted to the box with corresponding different single gang covers being mounted over these electrical boxes as well. This distance can be tor example at least two inches.

Box 30 is configured as a double gang box which is configured to be mounted on an exterior portion of a wall and designed to receive two different single gang electrical devices or a single integrated double gang electrical device.

This view also shows a back mounting bracket including first end 34a and second end 34b as well as holes 35a, 35b, 35c, 35d, 35e, and 35f for mounting the universal box to another surface. In addition, there are different wiring holes 39a, 39b, 39c, and 39d wherein wiring holes 39a and 39c are concentric with each other and wiring holes 39b and 39d are concentric with each other.

Furthermore, there is also shown a gasket 50 which can be comprised of any suitable type of sealing element such as plastic, metal or rubber, wherein, in at least one embodiment there is a thermoplastic rubber. In at least one embodiment, the gasket 50 is at least partially made of rubber such that it is configured to seal the interior of the box from any exterior elements when a bracket such as an adapter or frame 60 is coupled to the box. Gasket 50 is discussed in greater detail in FIGS. 7A-7C.

Frame 60 comprises first and second openings 61a and 61b, (See FIG. 6a) as well as a central face 62. In addition, a support extension 64 is coupled to central face 62 and extends therein away from central face 62. Frame 60 is discussed in greater detail in FIGS. 6A-6E. Central face 62 is spaced a sufficient distance to allow two different single gang electrical devices to be mounted to the two individual connection interfaces with two different single gang adapter covers being mounted over these electrical devices. In at least one embodiment the width of central face 62 could be 1 inch, approximately 1 inch or at least one inch, in at least one additional embodiment the width of central face 62 could be 1.25 inches, while in at least one further embodiment the width of central face 62 could be at least 1.5 inches.

In addition, a plurality of plates 20 having grounding wiring 20a can be set inside of the first and second openings 61a, 61b of the frame 60 to create a universally adaptable face for mounting electrical devices.

FIG. 4A is a front view of the second embodiment of the box 30 which also shows a connection interface 31 having a plurality of connection elements formed by sliding posts. These connection elements comprise a plurality of sliding posts 33a, 33b, 33c and 33d, wherein sliding posts 33a and 33b form a first set of parallel spaced sliding posts, while sliding posts 33c and 33d form a second set of sliding posts. These posts are configured to support a frame 60 when it is inserted into the box.

FIG. 4B is a side, cross-sectional view of the embodiment shown in FIG. 4A taken along the Axis 30i. Since the box is symmetrical, this view can either be a top cross-sectional view looking down at the bottom half of the box or a bottom cross sectional view looking up at the top of the box. In this view, there is shown wiring holes 39c and 39a which are concentric with wiring holes 39a and 39b shown in FIG. 3.

As shown, there are recesses 43a, 43b, 43e, and 43f shown based upon a bottom view looking up at the device. In addition, there is also shown a top down view, wherein recesses 43g, 43h, 43c and 43d are shown.

FIG. 4C shows a top view which shows posts such as posts 38a, 38b, 38c, 38d, 38i, 38j, 38k and 38l extending outside of the box. This additional extension allows for the sealing gasket and the frame to be placed on the box and still provide a post that can be used to allow an electrical device such as a strap mounted electrical device or a non strap mounted electrical device to be coupled to the box 30.

FIG. 5A is a perspective view of the embodiment shown in FIG. 4A which shows posts 38a-38p with their respective configurations as shown in FIG. 4A. In addition this view also shows wiring holes 39c and 39d. This view also shows a connection interface 31 for at least two different ganged electrical devices. In this connection interface are recesses 43a, 43b, 43e and 43f shown in greater detail in FIG. 4B.

Essentially, a connection interface 31 is formed on the front end of the box and can comprise any one of posts or other types of connection elements such as first group of posts 38a-38h, forming a first connection interface along with the respective side walls formed by rims 36 and 36a. If a frame 60 is added or a plate 20 is added these connection elements can also be used to form the connection interface.

Figure 5B:
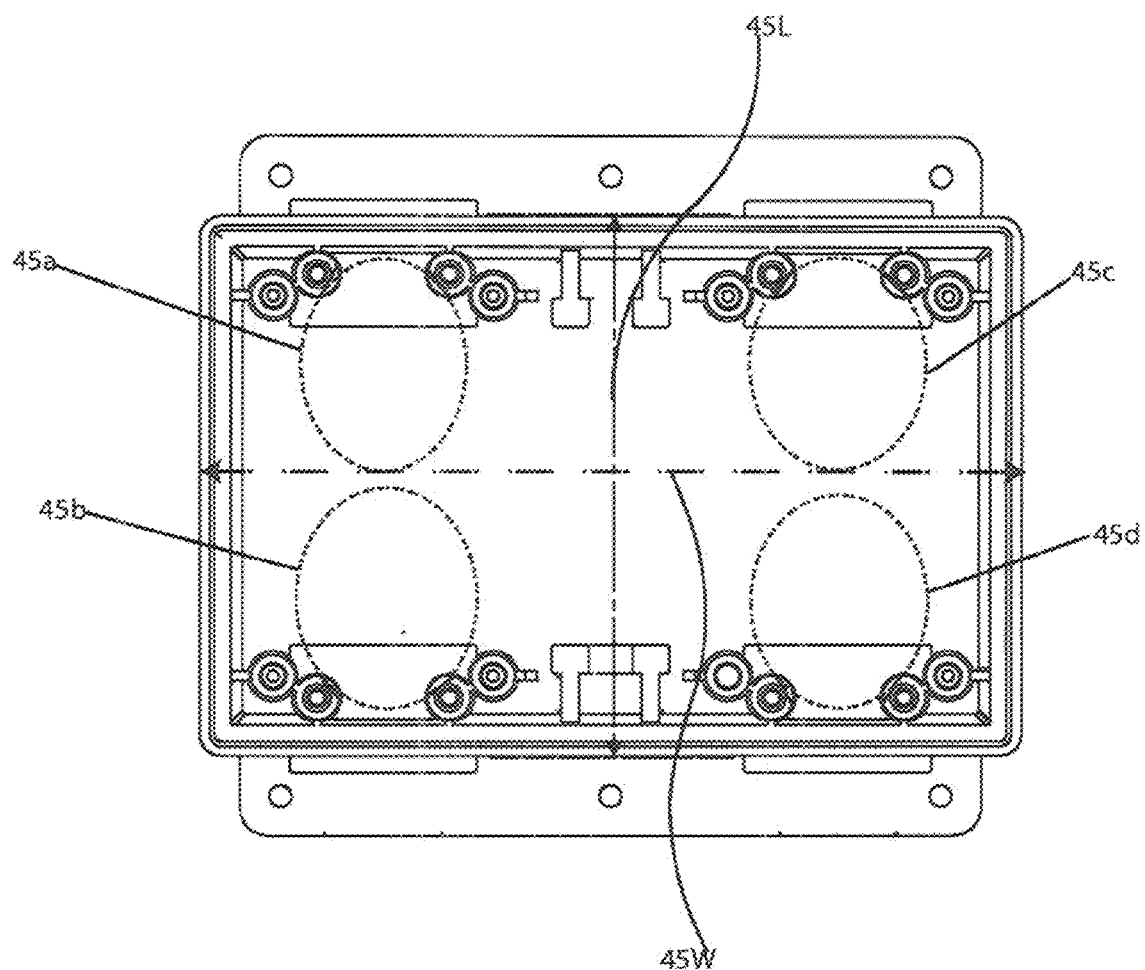
FIG. 5B shows a front view of a double gang enclosure showing connection regions for a duplex electrical device.

FIG. 5B shows a front view of the double gang box showing connection or mounting regions 45a, 45b, 45c, and 45d, which represent substantially rounded openings such as circular shaped or oval shaped openings, formed in the connection interface 31 and which are configured to receive circular shaped electrical devices such as a duplex receptacle. With this design, because the box 30 is a double gang box, the box 30 is configured to receive two different electrical devices such as two different single gang duplex receptacles installed side by side in the box (See for example FIG. 11B).

FIG. 6A is a front view of a frame 60 for use with the universal box of FIG. 3. Frame 60 includes first and second openings 61a and 61b, as discussed above. First opening 61a includes outer rim 62a, tabs 63a and 63b, inner rim 65a as well as cut outs 65b, 65c, 65d and 65e. In addition, second opening 61b includes outer rim 62b and also includes tabs 67a and 67b as well as an inner rim 66a as well as cut outs 66b, 66c, 66d, 66e. Central face 62 is configured to divide these first and second openings 61a and 61b, and as disclosed above is configured to space two different single gang devices and their respective covers apart.

Figure 6F:
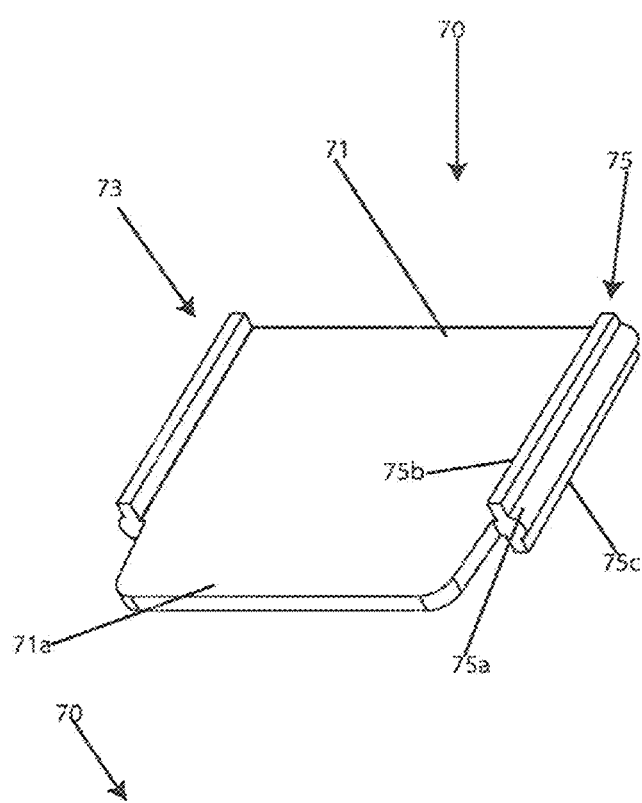
FIG. 6F shows a side perspective view of a planar board isolator.

In addition, support extension 64 (See FIG. 6B-6F) is coupled to central face 62 and extends therein away from central face 62. Support extension 64 is configured to line up with sliding posts 33a, 33b, 33c, and 33d (See FIG. 4A) such that support extension 64 slides on top of these sliding posts to be supported on these sliding posts to be easily supported on an associated box. FIG. 6C shows the side view of this bracket which shows a semi-circular cut out 64a of this support extension 64. Cut-outs 64a is formed to allow a user to extend his or her hand through from one area to another inside of box 30.

In addition FIGS. 6F-6I show different views for an isolator 70, which can comprise a planar board. This isolator 70 then completely divides two different ganged enclosures so that low voltage wiring can be fed into each now separate box without any interference from the wiring of the other box. This isolator 70 can be configured from any suitable material such as plastic, PVC, or any ether type material.

Isolator 70 comprises a central section 71, first and second ends 73 and 75 wherein first end 73 comprises a central rounded hub 73a, and two wings 73b and 73c. In addition, second end 75 comprises a central rounded hub 75a and two wings 75b and 75c. When isolator 70 is inserted into the slot formed by sliding posts 33a, 33b, 33c, or 33e, or sliding posts 83a, 83b, 83e and 83f (FIG. 6J) or into a region formed by sliding posts 83c, 83d, 83g and 83h. Isolator 78 would then divide the box into different compartments. With this design, first and second ends 73 and 75 would slide into this region. In addition, region 71a formed from section 71 would then extend out from this region. A frame 60 or 100 could then slide in over this region 71b, thereby sealing oft with this region inserting into semi-circular cut out 64a of support extension 64.

Figure 6G:
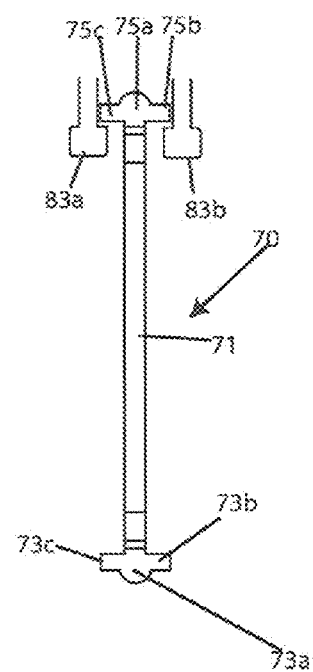
FIG. 6G shows an end view of the planar board isolator.
Figure 6H:
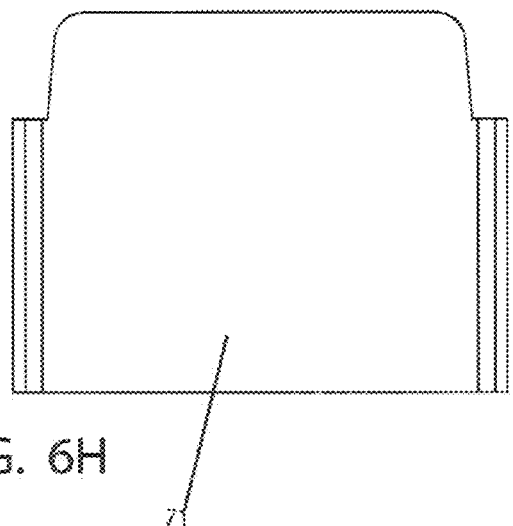
FIG. 6H shows a side view of the planar board isolator.
Figure 6I:
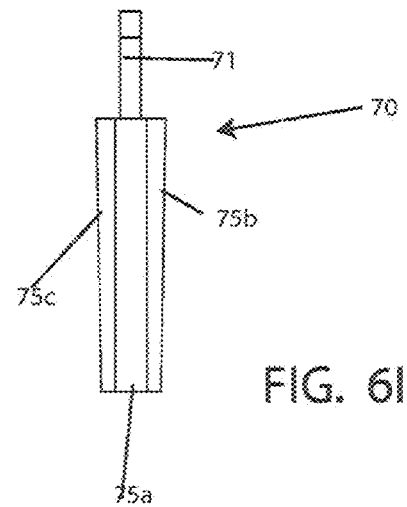
FIG. 6I shows another end view of the planar board isolator taken from the right side in FIG. 6F.

For example, FIG. 6G shows how wings 75*b* and 75*c* would slide into a region formed by sliding posts 83*a* and 83*b*. Wings 75*b* and 75*c* would extend over sliding posts 83*a* and 83*b* so that these posts would lock this isolator 70 into place.

Figure 6K:
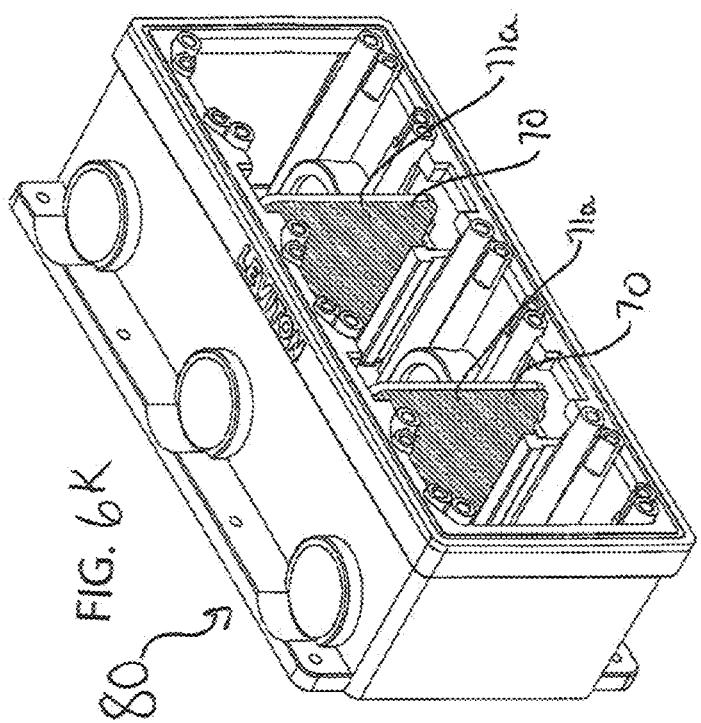
FIG. 6K is a perspective view of the isolator inserted into a box.
Figure 6J:
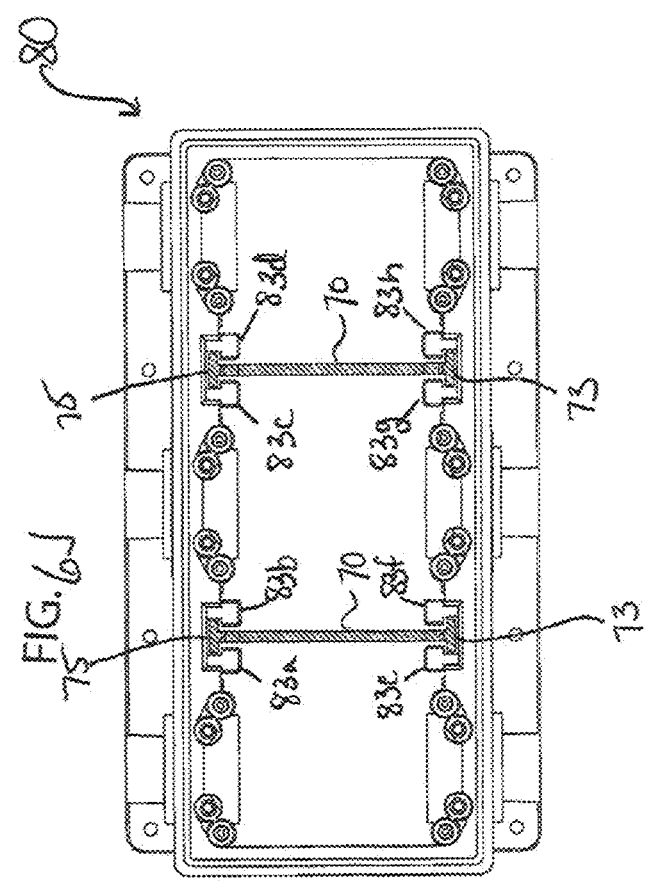
FIG. 6J is a front view of the isolator inserted into a box.

FIG. 6J is a front view of triple gang box 80 with multiple isolators 70 inserted info the triple gang box 80. In this view there are sliding posts 83*a*, 83*b* 83*e*, and 83*f* surrounding ends 75 and 73 respectively of isolator 70. In addition, there are sliding posts 83*c*, 83*d*, surrounding end 75, and sliding posts 33*g* and 33*h* surrounding end 73 thereby securing isolator 70 within box 80.

FIG. 6K shows a perspective view of box 80 which shows multiple isolators 70 inserted therein. This view shows how end 71*a* of isolator 70 extends out towards the front side of box 80. This end 71*a* allows support extension such as support extension 64 or 104*a* or 104*b* to fit over this end 71*a*. Thus, this isolator 70 is configured to isolate each gang of a box, while still allowing a frame such as frame 60 or frame 100 to fit onto a front end of the box. Another benefit of the isolator 70 in combination with a triple gang box 80 is that a triple gang box 80 when divided up by isolator 70 creates three separate single gang boxes which have a larger interior volume for fitting additional wires or components therein. For example, the volume of an individual box such as box 10 could be approximately 26 cubic inches while the volume for a divided single gang compartment of a triple gang box 80 or a double gang box 30 would be approximately 31 cubic inches. The larger volume would therefore allow for more wires to fit inside of the box. This benefit along with the benefit of fitting low voltage wiring inside of each divided compartment provides additional benefit for isolating each single gang compartment of a multiple gang box.

FIG. 7A is a perspective view of the gasket 50 which includes a corresponding gap or post 52*a*, 52*b* configured to receive support extension 64. Gasket 50 includes an outer rim 51, and an inner lip or rim 53. Posts 52*a* and 52*b* are cut out from inner lip or rim 53. In addition, there are a plurality of cut outs 55*a*, 55*b*, 55*c*, 55*d*, 55*e*, 55*f*, 55*g* and 55*h* which are configured to line up with respective posts 38*b*, 38*c*, 38*j*, 38*k*, 38*f*, 38*g*, 38*n* and 38*o*. FIG. 7B shows a front view of this gasket 50 and FIG. 7C shows a back view of gasket 50.

Gasket 50 also includes at least one, but in this embodiment two grooves, one groove 58*a* on a first or front side and another groove 58*b* on a back or opposite side. Gasket 50 is configured to index with rim 36*a* on box 30, and rim 62*b* on the back end of frame 60.

FIG. 8A is a perspective view of a triple gang universal box 80 with FIG. 8B being the front view. FIG. 8C shows a cross-sectional view taken along the line 80*i* while FIG. 8B shows a top or bottom view with both views being identical or substantially identical. This box 80 includes first side wall 37*a*, second side wall 87*b*, third side wall 87*c* and fourth side wall 87*d*, wherein first and third side walls 87*a* and 87*c* are parallel or substantially parallel to each other; while second and fourth side walls 87*b* and 87*d* are parallel or substantially parallel to each other, and substantially perpendicular to first and third side walls 87*a* and 87*c*. Box 80 also includes a rim 86 which forms a wider opening area, and wherein there is a front edge rim 86*a* which, extends out from rim 86. Front edge rim 86*a* is configured to index with an associated groove on a gasket such as gasket 90 shown in FIGS. 9A and 9B.

Rim 86 surrounds an opening in box 80 which provides a connection interface 79. Connection interface 79 comprises this opening along with the different connection elements such as connection elements or posts 88*a*-88*x* spaced around this opening.

There is also first and second mounting brackets 84*a* and 84*b* extending out from the box wherein first mounting bracket 84*a* has screw holes 85*a*, 85*b*, 85*c* and 85*d*. Second mounting bracket 84*b* has screw holes 85*e*, 85*f*, 85*g*, and 85*h* wherein these screw holes are configured to allow screws or other mounting elements to mount the box on a wall.

In addition, there are sliding posts 83*a*, 83*b*, 83*c*, 83*d*, 83*e*, 83*f*, 83*g*, and 83*h*. These sliding posts create a slot for allowing an isolator to be inserted therein.

Furthermore, the box 80 includes at least one but even up to three different connection interfaces each comprising a plurality of different connection elements comprising a plurality of different posts 88*a*-83*x*, with the first group of posts 83*a*-88*h* forming a first group for a single gang electrical enclosure, a second group of posts 88*i*-88*p* forming a second group of posts configured in a substantially identical respective manner to the posts 38*a*-38*h*, and posts 88*q*-88*x* forming the third respective substantially identical group. In addition, wiring holes 89*a*, 89*b*, 89*c*, 89*d*, 89*e* and 89*f* are set into the box, wherein wiring holes 89*a* and 89*a* are concentric with each other, wiring holes 89*b* and 89*e* are concentric with each other, and wiring holes 89*c* and 89*f* are concentric with each other.

FIG. 8E is a cross-sectional view of box 80 taken along line A-A and this view shows that it can be either a bottom cross sectional view looking up to a top or first side, relative to FIGS. 8A and 8B, or an opposite top down view looking at the bottom side. In this view, from the bottom up view, there are recesses 81*a*, 81*b*, 81*e*, 81*f*, 81*i*, and 81*j* formed respectively in posts 88*b*, 88*c*, 88*j*, 88*k*, 88*r*, and 88*s*. From the opposite, top down view looking at the bottom, there are shown recesses 81*k*, 81*l*, 81*g*, 81*h*, 81*c* and 81*d*, formed respectively in posts 88*w*, 88*v*, 88*o*, 88*n*, 88*u*, and 83*f* (see FIG. 8C). FIG. 8F shows the result of these recesses, which result in substantially enlarged, and substantially round or even circular connection regions such as regions 82*a*, 82*b*, 82*c*, 82*d*, 82*e*, and 82*f* formed in this box. This design would allow for the installation of a plurality of different front covers to be mounted side by side inside of this box. For example, standard duplex electrical receptacles such as those shown with covers 120*a* and 120*b* in FIGS. 11A-11C can then be installed into this box.

FIG. 9A is a perspective view of a triple gang gasket 90, and FIG. 9B is a front view of the gasket 90. Gasket 90 includes a plurality of gaps 92*a* and 92*b*, 92*c* and 92*d* configured to receive a support extension from an associated frame. Gasket 90 includes an outer rim 91, and an inner lip or rim 93. In addition, there are a plurality of cut outs 93*a*, 95*b*, 95*c*, 95*d* 95*e*, 95*f*, 95*g*, 95*h*, 95*i*, 95*j*, 95*k*, and 95*l* which are configured to line up with respective posts 88*b*, 88*c*, 88*j*, 88*k*, 83*r*, 88*s*, 88*f*, 88*g*, 88*h*, 88*o*, 88*v*, and 88*w*. Furthermore, a groove 98 is configured to align with front edge rim 86*a* on box 80 (See FIG. 8D). In addition, a groove (not shown) is on an opposite face and is configured to align with an extending rim 107*b* on a back side of frame 100.

FIG. 10A is a front perspective view of a triple gang frame 100 which has a body section 100*a* and includes two support extensions 104*a* and 104*b* as well as two spacing faces 102*a* and 102*b*. These two spacing faces provide sufficient spacing such as spacings 102*i* and 102*ii* to allow multiple individual single gang electrical devices, as well as their individual single gang front covers to be mounted to the box over their respective devices. For example, as described above, this spacing of this front face could be at least 1 inch, or at least 1.25 inches or at least 1.5 inches.

In addition, there are three openings 101*a*, 101*b*, and 101*c* bounded by outer rims 103*a*, 103*b*, and 103*c*, as well as inner rims 105a, 105b, and 105c. This design also includes tabs 106a, 106b, 106c, 106d, 106e and 106f disposed in their respective openings. Each of the two support extensions 104a, and 104b includes a semi-circular cut out 109a, 109b which allows for additional room inside of an associated universal box 80. There are also cut outs in inner rims 105a, 105b, and 105c wherein these cut outs allow for access to associated inner posts. For example, there are cut outs 108a, 108b, 103c, and 108d which allow access to posts 88b, 88c, 88f, and 88g, while cut outs 108e, 108f, 108g, 108h allow access to posts 88j, 88k, 88n, 88o, while cut outs 108i, 108j, 108k, and 108l allow access to posts 88r, 88s, 88v, and 83w thereby allowing an additional front plate to be mounted thereon. These cut outs 108a-108l are configured to receive or are configured to be allowed to receive screws or other types of fasteners configured to fasten an electrical device and also correspondingly the frame to a triple gang box.

This embodiment also includes extending rims 107a which extend out from a front side, while an extending rim 107b extends out from a back side. These extending rims allow the device to be indexed with other elements such as gasket 90 wherein extending rim 107b would fit inside of a complementary groove 97 (not shown) on gasket 90.

This triple gang box 80 is configured to be able to receive front plates that can be in the form of a single triple gang front plate 20 so that strap based devices can be mounted, non strap based devices can also be mounted or front covers can also be mounted to any one or all of the connection interfaces.

FIG. 10C is a back view of the frame 100 shown in FIG. 10A, in this view there is shown support extensions 104a and 104b wherein these support extensions include semi-circular cut outs 109a and 109b shown in greater detail in FIG. 10D, wherein, these cut outs are configured to allow a user to move his fingers inside of the triple gang box.

These designs with the body or housing such as boxes 10, 30, and 80 in the form of respective single gang, double gang or triple gang enclosures provide for a universally adaptable box which is configured to receive multiple different style electrical devices therein. In addition because frames are also available, along with corresponding gaskets, this allows for a universally adaptable interface for universal boxes which thereby allows a person using this box to have a wide variety of means for connecting these devices.

Figure 11A:
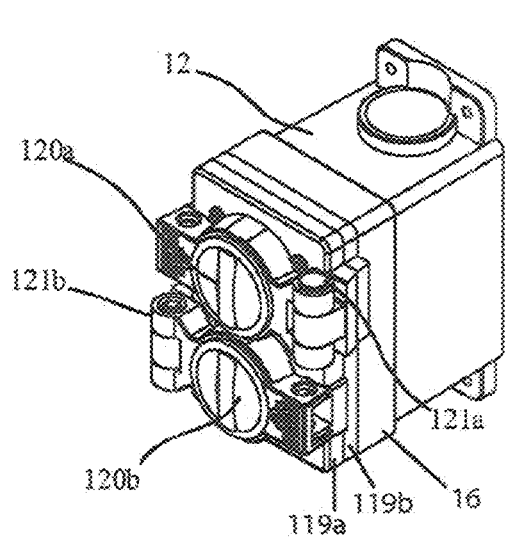
FIG. 11A is a front perspective view of the assembled design of a single gang enclosure.

FIG. 11A shows a front perspective view of the completed box which includes the body 12, a front rim 16, along with sealing adapter covers 120a and 120b disposed on a two part frame comprising frames 119a and 119b. As stated above, because of a plate, a strap mounted electrical device can be mounted to an electrical box, with an additional unincorporated single gang cover being mounted independently and separately over the strap mounted device. Once the two components are mounted on the single gang box, they can remain coupled to the box simultaneously due to the universal mounting face.

Figure 11B:
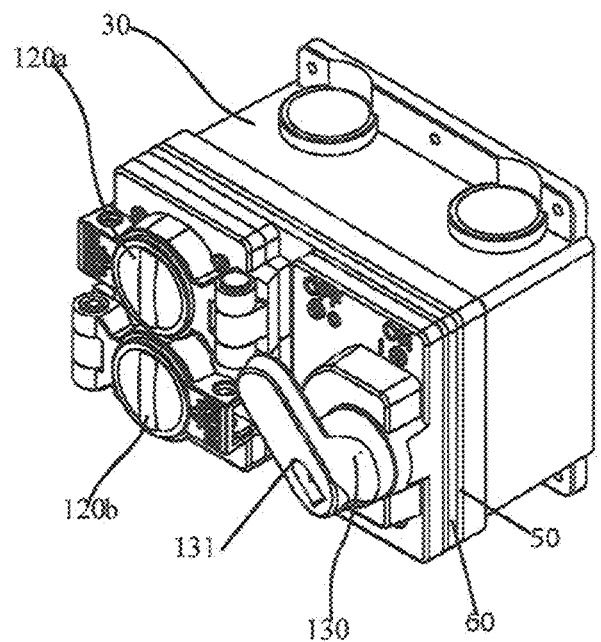
FIG. 11B is a front perspective view of the assembled design of the double gang enclosure.

FIG. 11B is a perspective view of a double gang box which includes a box 30, along with adapter covers 120a, and 120b. In addition, there is a toggle switch 130 which includes a handle 131. Covers 120a, 120b, and toggle switch 130 are all coupled to box 30 with gasket 50, and frame 60 being positioned in between. As described above, gasket 50 provides a water resistant seal, while frame 60 provides individually mountable sections for two different single gang electrical devices, which can be mounted via a strap style mounting by using an additional plate such as plate 20. As described above, with this design, frame 60 includes a central face 62 which provides a sufficient spacing distance to allow for a hinge overhang such as via hinge 121a, wherein this hinge overhang would not interfere with a separately mounted single gang device such as a toggle switch 130.

Figure 11C:
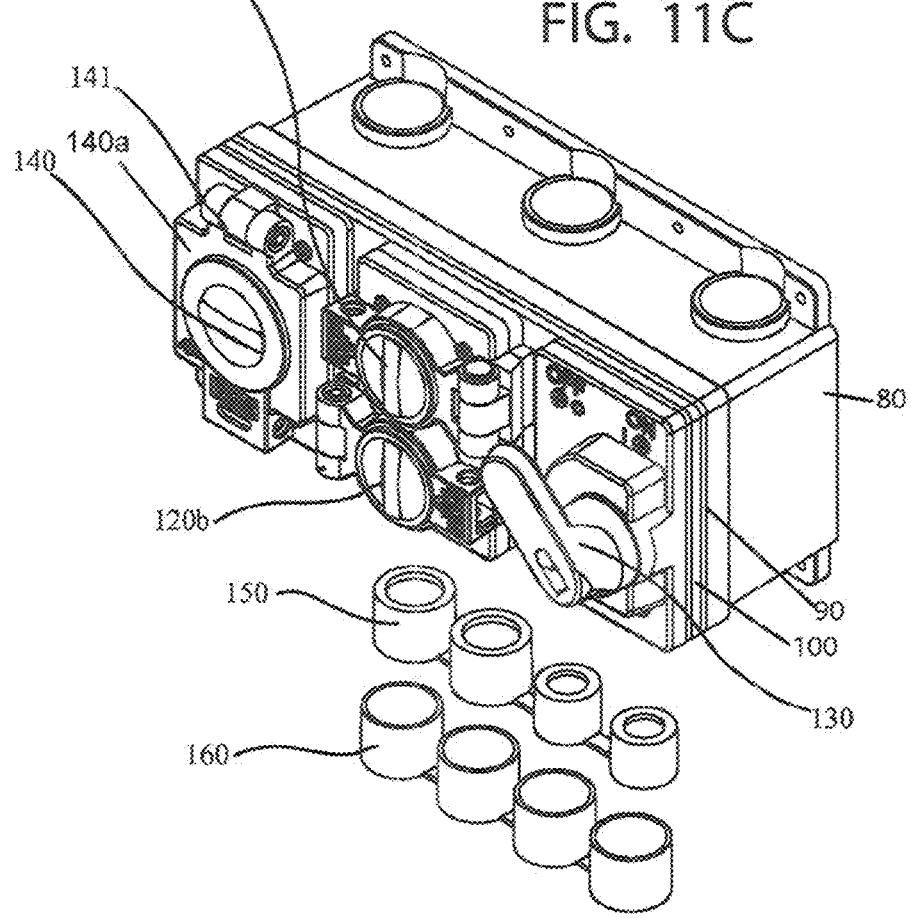
FIG. 11C is a front-top perspective view of the assembled triple gang enclosure.

FIG. 11C is a front-top perspective view of the triple gang enclosure, wherein in this view there is a triple gang box 80 which has a front cover 140 which includes a cover section 140a along with a hinge 141. This cover 140 is configured to cover and seal this section of the triple gang box. In addition, there are shown adapter covers 120a and 120b along with hinges 121a and 121b.

This view also shows box 80 which is a triple gang box, and which has associated with it gasket 90 and frame 100. As described above, gasket 90 along with frame 100 creates a water resistant seal with box 80, wherein frame 100 allows three different individual single gang devices to be mounted to the box 80. In addition, in each of the single gang openings formed by frame 100, plate 20 can be used to allow strap based electrical devices to be mounted on the front face. However, because this box design 80 includes both inner and outer sets of posts for each of the single gang enclosures, additional front covers such as adapter covers 120a and 120b, toggle switch 130 and cover 140.

As described above, because frame 100 includes spacing faces 102a and 102b (See FIG. 10B), these spacing faces provide sufficient spacing so that three individually mounted single gang devices with their individually mounted single gang covers can be mounted side by side on a multi ganged box such as on triple gang box 80. Thus, there is no need to form a single integrated multi-ganged cover for covering all three devices because the spacing provided by spacing faces 102a and 102b allows for the individual mounting of the electrical devices and their associated individual covers.

Furthermore, there are shown both reducers 150 configured to be received inside of holes such as wiring holes 19a, and 19b (See FIG. 1A). In addition, caps 160 are shown for plugging these wiring holes. Multiple different sized reducers or caps can be used to either reduce the diameter for receiving a feed pipe or for plugging a hole.

All of these elements including any one of box 10, box 30 or box 80, gasket 50, frame 60, gasket 90 and frame 100 can each be sold as a kit along with other optional parts such as caps 160 and reducers 150 which fit inside of holes such as wiring holes 19a and 19b.

As stated above, these type boxes with both the inner and outer sets of mounting poses, allow both strap mounted devices and non strap mounted devices to be simultaneously or separately mounted on a box such as a FD box, with the FD cover or front cover being mounted on top. With the designs of FIGS. 11A-11C, a scrap based electrical device such as a switch is mounted first on the FD box, and then the front cover 136 (see FIG. 14A) is mounted on the box such as box 10. The front cover 136 covers the switch and keeps it from becoming impinged or corroded by elements. In addition, because covers such as cover 136 can be mounted on the box over a strap mounted device, additional devices such as toggle switch 130 can be placed over the switch to create a switch having a threshold tripping mechanism which biases the switch in either an "on" position or an "off" position wherein these positions relate to whether power is passed to a downstream load associated with the switch.

Figure 12A:
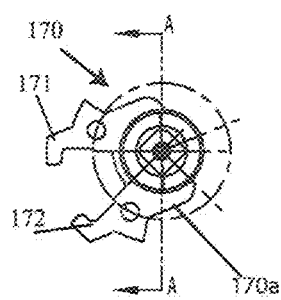
FIG. 12A is a top view of a switch mechanism.
Figure 12B:
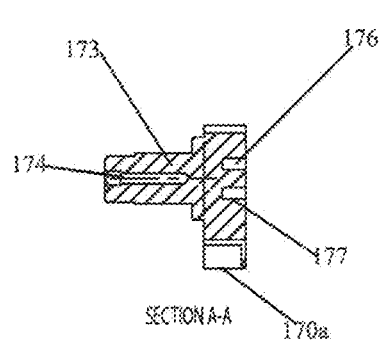
FIG. 12B is a side cross-sectional view of the switch mechanism.

FIG. 12a is a top view of a switch mechanism or actuator 170 which includes a body section 170a, and arms 171 and 172 forming a fork. FIG. 12B is a side cross-sectional view of the switch mechanism 170 which includes body section 170a, a post section 173, and a central hole 174 extending into post section 173. Central hole 174 is for receiving a screw or bolt for securing this switch mechanism to an adjacent housing.

There are also holes or relief 176 and 177 with hole 176 configured radially out from a center region while hole 177 is configured to be in a central region of body section 170a.

Figure 12C:
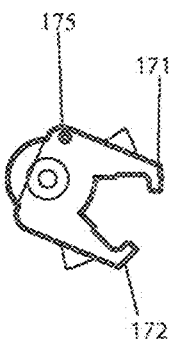
FIG. 12C is a bottom view of the switch mechanism.

FIG. 12C is a bottom view of the switch mechanism 170 which shows radial hole 175 along with arms 171 and 172 coupled to body section 170a. Radial hole 175 is configured to receive an end of spring 180 shown in FIG. 12F.

Figure 12D:
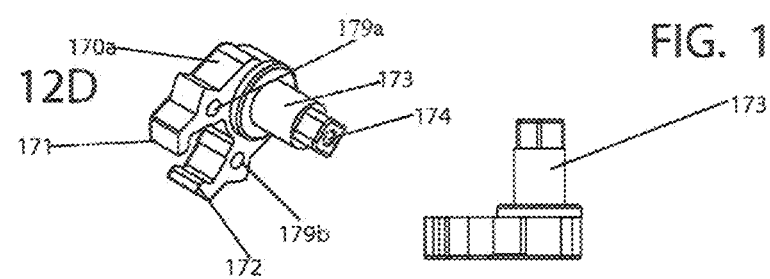
FIG. 12D is a perspective view of the switch mechanism.

FIG. 12D is a perspective view of the switch mechanism 170 having arms 171 and 172, as well as holes 179a and 179b in arms 171 and 172 respectively. There are also shown protrusions 171a and 171b (See FIG. 12G) which are configured, as protrusions to control the mounting orientation and which prevents the installation of the actuator in a wrong orientation or positron.

Figure 12E:
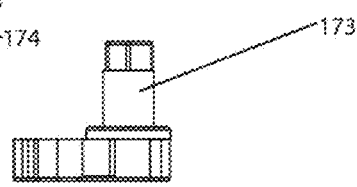
FIG. 12E is a side view of the switch mechanism.

FIG. 12E is a side view of the switch mechanism 170 which shows post section 173.

Figure 12F:
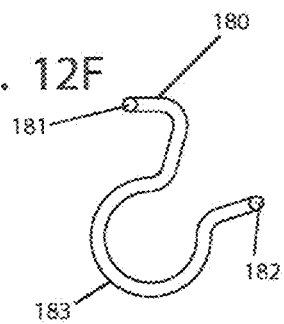
FIG. 12F is a view of the spring associated with the switch mechanism.

FIG. 12F is a view of spring 180 which has a first end 181 and a second end 132. There is also an intermediate curved section 183 which is configured to act as a spring, selectively compressing and expanding based upon movement of toggle switch 130.

Figure 12G:
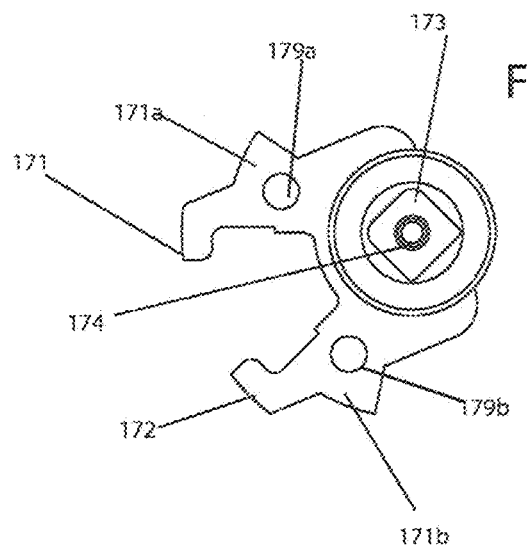
FIG. 12G is a close up view of the switch mechanism taken from FIG. 12A.

Spring 180 is coupled to switch mechanism 170 such that the first end 181 is coupled to radial hole 175 while the second end 182 is coupled to the housing for housing the device of the switch mechanism. FIG. 12G is a close up view of the switch mechanism 170 taken from FIG. 12A wherein in this view, there is shown post section 173, center hole 174, arms 171 and 172, holes 179a, and 179b as well. This switch mechanism 170 is coupled to spring 180 and is coupled inside of a housing 139 such as that shown in FIG. 14A.

Figure 13:
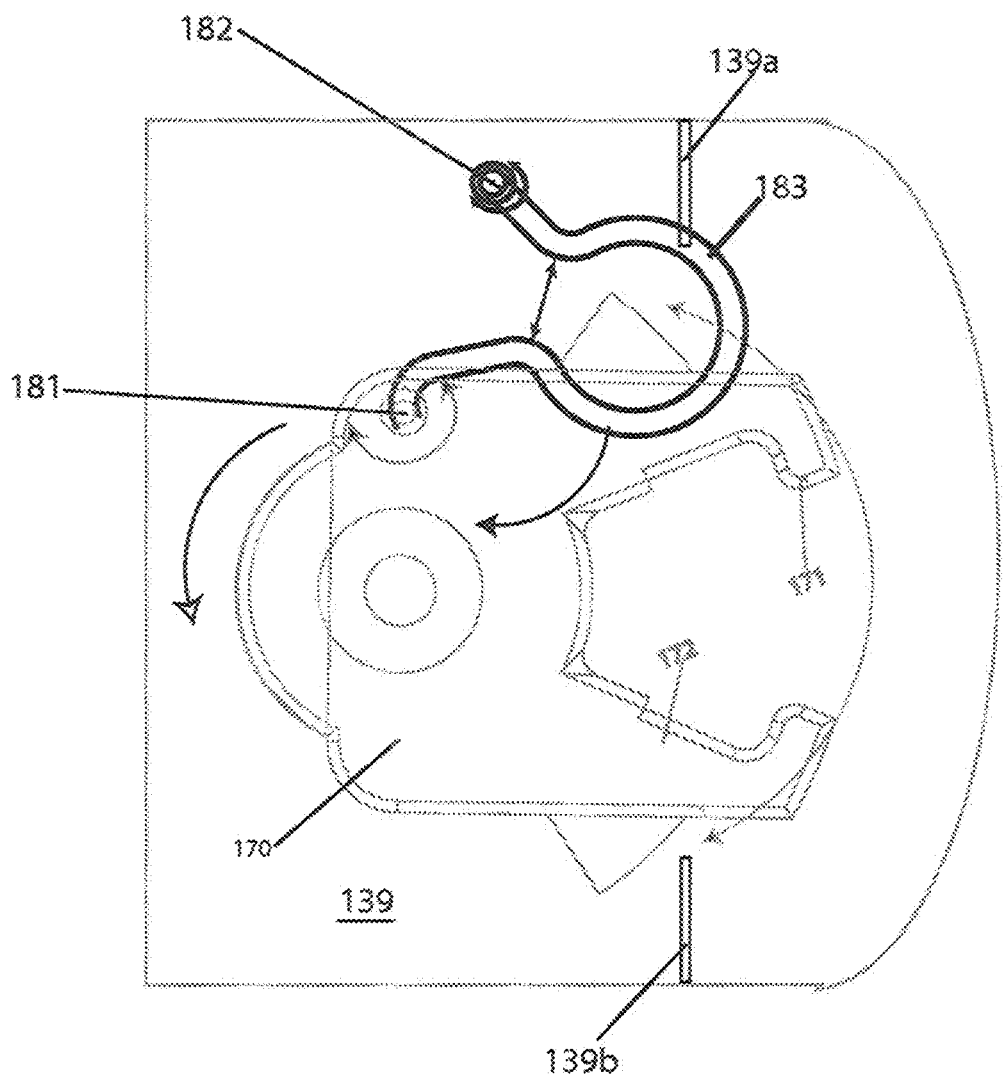
FIG. 13 is a bottom view of the switch mechanism coupled to a spring.

FIG. 13 is an enlarged view of the switch mechanism 170 coupled to spring 180 with a first end 181 being inserted into radial hole 175 and a second end 182 being coupled to a stationary portion or post of a housing 139. When the switch mechanism 170 is rotated, from either an on or an off position, as shown by the arrow crossing over arms 171 and 172 of the fork, this causes a temporary compression of spring 180 in region 183. Once the rotation reaches a threshold tripping point or position, the compression of the spring forces the movement forward so that the spring expands so that the switch mechanism 170 completes its rotational motion. This motion results in the arms 171 and 172 then resting either on stop 139a or stop 139b which represent either an on or an off position for an associated switch. Thus, during the initial rotational movement, the spring 180 is compressed further, however, after hitting or passing the threshold point, the spring 180 is pushed into a position where it can expand such that it forces continued rotational movement on to the second position. Thus, the switch mechanism 170 in combination with spring 180 turns an unbiased switch into a rotationally biased lever for actuating a switch.

Figure 14A:
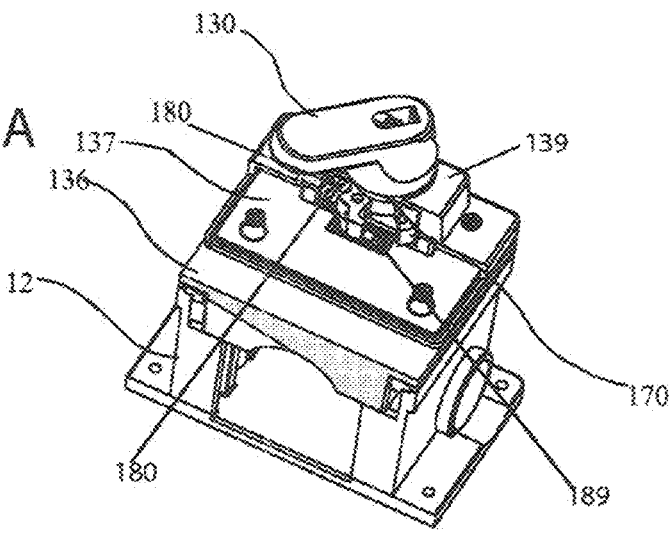
FIG. 14A is a top perspective view of a toggle switch shown in FIG. 11B, showing the toggle switch in a first position.

FIG. 14A is a top perspective view of a body 12 having a first cover 136, and a second cover 137 wherein these covers along with third cover 139 are coupled to toggle switch 130 shown in FIG. 11A. Toggle switch 130 is in a first position, however, this shows a correspondingly small switch 189.

Figure 14B:
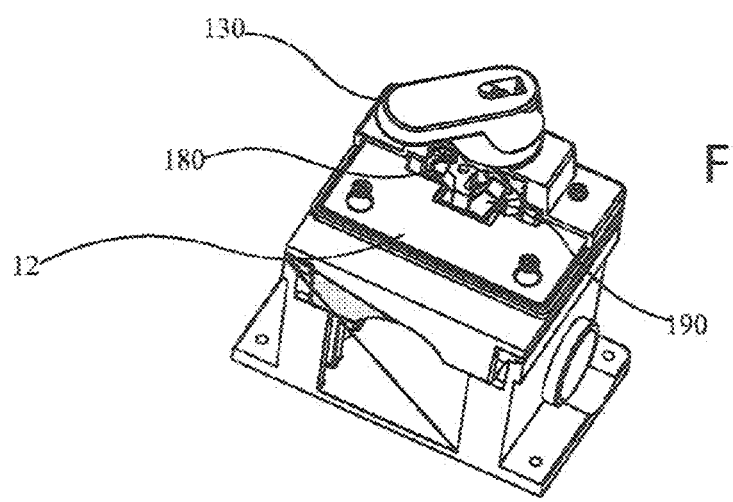
FIG. 14B is a top perspective view of the toggle switch shown in FIG. 13A in a second position.

FIG. 14B is a top perspective view of the toggle switch 130 shown in FIG. 14A in the first position, however the switch 190 is in physical communication with switch mechanism 170. Switch 190 is configured to be moved by the rotation of toggle switch 130 which acts on arms 171 and 172. When toggle switch 130 is rotated such as in the direction of the arrow (FIG. 13), this rotation of the lever rotates arms 171 and 172 such that these arms act upon switch 190. In addition, this switch mechanism 170 in conjunction with spring 180 is configured to be biased in either a first position or a second position, but to generally resist being stuck in a middle position between the first position and the second position.

Figure 14C:
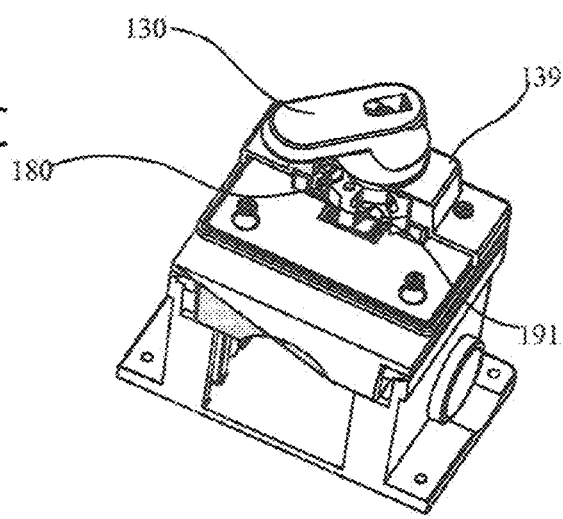
FIG. 14C is a top perspective view of the toggle switch shown in FIG. 13A in a third position.

FIG. 14C shows the switch mechanism in contact with another type of switch 191 which is essentially a smaller version of switch 190 shown in FIG. 14B.

The rotation of toggle switch 130 allows for the easier switching and a mechanical, advantage to moving switch 190 than if that switch was already available. In addition, because switch mechanism 170 also includes a spring 180, this allows for a singular on/off movement which allows the toggle switch to be thrown from a first position to a second position, or back again without remaining in a middle position or preventing the actuator from remaining in a middle position between the first position and the second position. The first position can be either an "on" position or an "off" position while the second position can foe either an "on" position or an "off" position.

Ultimately the above design(s) provide for an electrical box such as box 10, 30, or 80 comprising a body having at least one opening forming a connection interface 11, 31, or 79 for receiving an electrical device, and at least one opening for receiving electrical wiring such as wiring holes 19a, 19b, 39a, 39b, 39c, 39d, 89a, 89b, 89c, 89d, 89e, 89f from building wiring. There can also be a connection interface 11, 31, 79 disposed in the opening of the respective box 10, 30, 80, wherein the connection interface 11 for box 10 comprises a first set of connection elements or posts 18a, 18d, 18e, and 18h, and a second set of connection elements or posts 18b, 18c, 18g, 18f. Box 30 comprises a first set of connection elements or posts 38a, 38d, 38i, 38l, 38e, 38h, 38m, and 38p or a second set of connection elements or posts 38b, 38c, 38j, 38k, 83f, 38g, 38n, and 38o. Box 80 comprises a first set of connection elements or posts 88a, 88d, 88e, 88h, 88i, 88l, 88m, 88p, 88q, 88t, 88u, 88x, and a second set of connection elements or posts 38b, 88c, 88f, 83g, 88j, 88k, 88n, 88o, 88r, 88s, 88v, 88w.

The first set of connection elements are configured to couple to a first type of mounting device, and the second set of connection elements are configured to couple to a second type of mounting device. In addition, at least one of the connection elements comprises a recess such as recesses 23a, 23b, 23c, and 23d in box 10, recesses 43a, 43b, 43c, 43d, 43e, 43f, 43g, and 43h in box 30, and recesses 81a-81l on box 80.

These recesses are configured to create a substantially round shaped mounting region such as mounting regions 29a, 29b, in box 10, mounting regions 45a, 45b, 45c, and 45d in box 80, and mounting regions 82a, 32b, 82c, 82d, 82e, and 82f on box 80 at the connection interface.

This design can also result in a method for providing a mounting interface. This method can include presenting at least one connection interface such as connection interfaces 11, 31, and 79, and then presenting a plurality of connection elements or posts 18a-h, 38a-p, 83a-x on the connection interface.

Next, the plurality of connection elements or posts 18a-18h, 38a-38p, and 88a-88x can be spaced around the respective connection interface 11, 31 and 79.

Next, each respective box can provide at least one recess such as recesses 23a-23d, 43a-43h, and 81a-81l in at least one of the connection elements or posts. The at least one recess is configured to receive an electrical device when the electrical device is mounted to the connection interface 11, 31, 79.

From this design, there can also be a method for providing a mounting interface comprising presenting at least one multiple gang enclosure having an open front face, such as connection interface 11, 31, and 79. Next, a frame such as frame 60 or frame 100 can be coupled to the at least one multiple gang box 30 or 80, over the open front face of connection interface 31 or 79. Frame such as frame 60 or 100 comprises a central face 62, or spacing faces 102*a* or 102*b* having a spacing such as spacing 102*i* and 102*ii* sufficient to space at least two different single gang front covers apart from each other on the multiple gang enclosure.

Thus, this configuration creates a universal box for mounting multiple different front covers on a single box design.

While the boxes can have any particular suitable dimensions taken along the length or the width such as length 29*l* or width 29*w*, or length 45*l*, or width 45*w*, or length 82*l* and width 82*w*, examples of the box dimensions are explained below. These dimensions are only examples of one embodiment and the claims are not limited to these dimensions unless these dimensions are included in the claims.

For example a single gang box can have a width from outer edge to outer edge 29*w* of approximately 3.125 inches while a length 29*l* from outer edge to outer edge of approximately 4.625 inches. Box 30 can have a width 45*w*, from outer edge to outer edge of approximately 7 inches, and a length 45*l* from outer edge to outer edge of approximately 4.625 inches. Box 80 can have a width 82*w* from outer edge to outer edge of approximately 10.825 inches and a length 82*l* from outer edge to outer edge of approximately 4.625 inches.

In addition posts, such as posts 18*a*, and 18*d* can be spaced apart from each other along a width dimension by approximately 1.875 inches from a center region on each post, while posts such as posts 18*b* and 18*c* can be spaced apart from each other along a width dimension by approximately 1.125 inches from a center region on each post. In addition, posts 18*a*, and 18*e* can be spaced apart from, each other by approximately 3.25 inches in a length dimension from a center region on each post, while posts 18*b* and 18*f* can be spaced apart from each other along a length dimension by approximately 3.624 inches from a center region on each post.

Recesses such as recesses 23*a*, 23*b*, 23*c*, and 23*d* can extend in at least 0.7 inches such as approximately 0.718 inches from a front edge of the box. The box depth such as box 10 can be approximately 3.5 inches from a front edge to a back surface. Recesses 23*c* and 23*d* are configured such that they have recess surfaces that are angled such that if these surfaces were extended they would intersect at a 110 degree or approximately 110 degree angle.

While the above embodiments are shown as examples, the claims are not limited to the above dimensions provided unless the claims are written to include particular dimensions.

Accordingly, while a few embodiments of the present invention have been shown and described, it is to be understood that many changes and modifications may be made thereunto without departing from the spirit and scope of the invention as defined in the appended claims.

The invention claimed is:

1. An electrical device mounting system comprising:
 a. a multiple gang electrical body having an open front face sized and configured to receive first and second electrical devices therein, the body further including first and second groups of connection elements accessible via the open front face, each of the first and second groups of connection elements comprising a first set of connection elements and a second set of connection elements;
 b. a frame including first and second device openings, the first and second device openings being aligned with the open front face of the body for receiving first and second electrical devices therein, respectively, each of the first and second device openings defining a single gang opening, and a spacing face dividing the first and second device openings into separate and distinct openings;
 c. first and second plates disposed in the first and second device openings of the frame, respectively, wherein the first and second plates are securable to the second set of connection elements of the first group of connection elements and the second group of connection elements respectively for coupling the frame and the first and second plates to the body, and the first and second electrical devices are secured to the first and second plates, respectively; and
 d. a plurality of single gang covers, each of the plurality of single gang covers comprising a cover section, one of the plurality of single gang covers adapted and configured to individually cover and seal the first device opening, and the other of the plurality of single gang covers adapted and configured to individually cover and seal the second device opening, wherein each of the plurality of single gang covers are securable to the first set of connection elements of the first group of connection elements and the second group of connection elements respectively, and wherein the spacing face of the frame provides a sufficient distance between the first and second device openings to enable a user to mount the plurality of single gang covers to the body.

2. The mounting system of claim 1, further comprising first and second electrical devices disposed in the first and second device openings, respectively, the first electrical device being covered and sealed by the one of the plurality of single gang covers and the second electrical device being covered and sealed by the other of the plurality of single gang covers, when the plurality of single gang covers are in the closed position.

3. The mounting system of claim 1, wherein at least one of the plurality of single gang covers include a hinge.

4. The mounting system of claim 1, wherein one of the plurality of single gang covers includes a hinge, and wherein the spacing face of the frame prevents the hinge from interfering with the other of the plurality of second single gang covers.

5. The mounting system of claim 1, wherein the spacing face is configured to space apart the one of the plurality of single gang covers from the other of the plurality of single gang covers.

6. The mounting system of claim 1, wherein the distance of the spacing face is at least one inch.

7. The mounting system of claim 1, wherein the distance of the spacing face is at least 1.5 inches.

8. The mounting system of claim 1, further comprising a gasket disposed between the frame and the body.

9. The mounting system of claim 1, wherein the first set of connection elements comprises an outer set of connection elements, and the second set of connection elements comprises an inner set of connection elements.

10. The mounting system of claim 9, wherein the second set of connection elements is recessed in the body relative to the first set of connection elements.

11. The mounting system of claim 9, wherein two connection elements of the first set of connection elements of the first group of connection elements is spaced a sufficient space apart from two connection elements of the first set of connection elements of the second group of connection elements to prevent the one of the plurality of single gang covers from interfering with the other of the plurality of single gang covers.

12. The mounting system of claim 1, wherein at least one of the plurality of single gang covers includes a plurality of independent and separate covers.

13. The mounting system of claim 1, wherein at least one of the plurality of single gang covers includes a toggle switch.

14. An electrical device mounting system comprising:
   a. a multiple gang electrical body having an open front face;
   b. a frame configured to be secured to the body, the frame being aligned with the open front face of the body, the frame including first and second device openings for receiving first and second electrical devices therein, respectively, each of the first and second device openings defining a single gang opening, and a spacing face dividing the first and second device openings into separate and distinct openings, wherein the frame further includes a support extension extending from the frame, and wherein the support extension is aligned with the spacing face and at least partially disposed in the body; and
   c. a plurality of single gang covers, each of the plurality of single gang covers comprising a cover section, one of the plurality of single gang covers adapted and configured to individually cover and seal the first device opening, and the other of the plurality of single gang covers adapted and configured to individually cover and seal the second device opening, wherein the spacing face of the frame provides a sufficient distance between the first and second device openings to enable a user to mount the plurality of single gang covers to the body.

15. The mounting system of claim 14, wherein the body further includes a plurality of posts adapted and configured to align with and support the support extension of the frame.

16. The mounting system of claim 15, further comprising an isolator, wherein the plurality of posts form a slot, and wherein the isolator is configured to be received within the slot to thereby divide the body into different compartments.

17. A method of assembling an electrical device mounting system, the method comprising the steps of:
   a. providing a multiple gang electrical body having an open front face, wherein the body includes first and second groups of connection elements accessible via the open front face, each of the first and second groups of connection elements comprising a first set of connection elements and a second set of connection elements;
   b. aligning a frame with the open front face of the body, wherein the frame includes first and second device openings for receiving first and second electrical devices therein, respectively, each of the first and second device openings defining a single gang opening, and a spacing face dividing the first and second device openings into separate and distinct openings;
   c. securing a first plate to the body via the second set of connection elements of the first group of connection elements, and securing a second plate to the body via the second set of connection elements of the second group of connection elements, wherein securing the first and second plates to the first and second set of connection elements, respectively, secures the frame to the body;
   d. disposing the first and second electrical devices in the first and second device openings, respectively, and securing the first and second electrical devices to the first and second plates, respectively;
   e. selecting a first single gang front cover from a plurality of available single gang front covers, wherein the first single gang front cover comprises a cover section and is adapted and configured to cover and seal the first electrical device;
   f. securing the first single gang front cover to the body via the first set of connection elements of the first group of connection elements;
   g. selecting a second single gang front cover from the plurality of available single gang front covers, wherein the second single gang front cover comprises a cover section and is adapted and configured to cover and seal the second electrical device; and
   h. securing the second single gang front cover to the body via the first set of connection elements of the second group of connection elements.

18. The method of claim 17, further comprising the step of disposing a gasket between the frame and the body.

19. The method of claim 17, wherein the spacing face is configured to space apart the first electrical device and the respective first single gang front cover from the second electrical device and the respective second single gang front cover.

20. The method of claim 17, wherein the first and second single gang front covers are independent and separate from one another.

21. The method of claim 17, wherein at least one of the first and second single gang front covers include a hinge.

* * * * *